United States Patent
Tan et al.

(10) Patent No.: US 10,954,403 B2
(45) Date of Patent: *Mar. 23, 2021

(54) INK COMPOSITION OF AN ORGANIC FUNCTIONAL MATERIAL

(71) Applicant: Merck Patent GmbH, Darmstadt (DE)

(72) Inventors: Li Wei Tan, Eastleigh (GB); Pawel Miskiewicz, Southampton (GB); Philip Edward May, Sidcup (GB); Daniel Walker, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 338 days.

This patent is subject to a terminal disclaimer.

(21) Appl. No.: 16/062,415

(22) PCT Filed: Nov. 25, 2016

(86) PCT No.: PCT/EP2016/001994
§ 371 (c)(1),
(2) Date: Jun. 14, 2018

(87) PCT Pub. No.: WO2017/102061
PCT Pub. Date: Jun. 22, 2017

(65) Prior Publication Data
US 2018/0371274 A1    Dec. 27, 2018

(30) Foreign Application Priority Data
Dec. 16, 2015  (EP) .................... 15200459

(51) Int. Cl.
C09D 11/36    (2014.01)
C09D 11/38    (2014.01)
(Continued)

(52) U.S. Cl.
CPC .............. C09D 11/36 (2013.01); C09D 11/03 (2013.01); C09D 11/033 (2013.01); C09D 11/38 (2013.01);
(Continued)

(58) Field of Classification Search
None
See application file for complete search history.

(56) References Cited

U.S. PATENT DOCUMENTS 6,465,558 B2 * 10/2002  Scheibelhoffer ........... C09J 5/00
                                                               524/315
6,762,234 B2 *  7/2004  Grizzi .................... C09K 11/06
                                                               427/445
(Continued)

FOREIGN PATENT DOCUMENTS

JP    20142292 A    1/2014
WO    WO-0116251 A1    3/2001
(Continued)

OTHER PUBLICATIONS

"Geraniol Profile" by Baker et al., http://hdl.handle.net/1813/56127, no date available; 13 pages.*
(Continued)

*Primary Examiner* — Helene Klemanski
(74) *Attorney, Agent, or Firm* — Faegre Drinker Biddle & Reath LLP

(57) ABSTRACT

The present invention relates to an ink composition comprising an organic functional material having a molecular weight of at most 5,000 g/mol and a first organic solvent selected from the group consisting of terpene, terpenoid, and combination of any of these, as well as to the use of the ink composition, an electronic device prepared by using the ink composition and method for preparing/fabricating thereof.

17 Claims, 12 Drawing Sheets

(51) Int. Cl.
*H01L 51/00* (2006.01)
*C09D 11/03* (2014.01)
*C09D 11/033* (2014.01)
*H01L 51/50* (2006.01)

(52) U.S. Cl.
CPC ...... *H01L 51/0004* (2013.01); *H01L 51/0007* (2013.01); *H01L 51/5016* (2013.01); *H01L 51/5056* (2013.01); *H01L 51/5072* (2013.01)

(56) References Cited

U.S. PATENT DOCUMENTS

| | | | |
|---|---|---|---|
| 7,166,664 B1 | 1/2007 | Anderson | |
| 8,758,649 B2* | 6/2014 | James | B82Y 10/00 252/500 |
| 8,974,702 B2 | 3/2015 | May et al. | |
| 9,206,352 B2* | 12/2015 | May | H05B 33/10 |
| 9,379,323 B2* | 6/2016 | James | H01L 51/0007 |
| 10,256,408 B2* | 4/2019 | James | H01L 51/0085 |
| 10,686,132 B2* | 6/2020 | May | H01L 51/0035 |
| 2002/0001026 A1 | 1/2002 | Ishikawa et al. | |
| 2003/0173563 A1* | 9/2003 | Grizzi | H05B 33/14 257/40 |
| 2007/0190251 A1* | 8/2007 | Abe | H01G 4/30 427/258 |
| 2011/0006265 A1* | 1/2011 | James | C09D 11/52 252/500 |
| 2013/0026415 A1* | 1/2013 | James | H01L 51/0005 252/301.16 |
| 2013/0026421 A1* | 1/2013 | James | H01L 51/0039 252/500 |
| 2019/0002722 A1* | 1/2019 | May | C09D 11/033 |

FOREIGN PATENT DOCUMENTS

| | | |
|---|---|---|
| WO | WO-03028451 A2 | 4/2003 |
| WO | WO-2009109273 A1 | 9/2009 |

OTHER PUBLICATIONS

Geraniol Chem Spider, www.chemspider.com/Chemical-Structure.13849989.html, no date available; 3 pages.*
Citronellol Chem Spider, www.chemspider.com/Chemical-Structure.92127.html, no date available; 3 pages.*
Citronellol Pub Chem, National Center for Biotechnology Information, PubChem Database; Citronellol, CID=8842; https://pubchem.ncbi.nlm.nih.gov/compound/3_7-dimethyloct-en-1-ol, no date available; 10 pages.*
"Viscosity of Citral" by Wohlfarth (2017), Physical Chem 29 (Viscosity of Pure Organic Liquids and Binary Mixtures), https://materials.springer.com/lb/docs/sm_lbs 978-3-662-49218 345; 1 page.*
Citral Chem Spider, www.chemspider.com/Chemical-Structure.553578.html, no date available; 3 pages.*
Carveol Chem Spider, www.chemspider.com/Chemical-Structure.7160.html, no date available; 3 pages.*
Terpineol Chem Spider, www.chemspider.com/Chemical-Structure.391434.html, no date available; 3 pages.*
Nguyen et al., "Solution processing of conjugated polymers: the effects of polymer solubility on the morphology and electronic properties of semiconducting polymer films"; Journal of Photochemistry and Photobiology A: Chemistry 144 (2001), pp. 21-30.*
Nagai, "Effect of Molecular Weight and Conformation on Photoluminescence Quantum Yield of Fluorene/poly(2-methoxy-5-(2'-ethylhyxyloxy)-1,4-phenylene vinylene) (MEH-PPV) Copolymers"; 2013 ECS J. Solid State Sci. Technol. 2(9) pp. R218-R224.*
International Search Report for PCT/EP2016/001994 dated Mar. 2, 2017.
Written Opinion of the International Searching Authority for PCT/EP2016/001994 dated Mar. 2, 2017.

* cited by examiner

Fig. 1
| | |
|---|---|
| 100 nm | Al Cathode |
| 40 nm | ETL |
| 10 nm | HBL |
| 60 nm | G-EML |
| 20 nm | HTL |
| 40 nm | HIL (Reference, example 1 and example 2) |
| 50 nm | ITO Anode |
| | Substrate |
Fig. 2
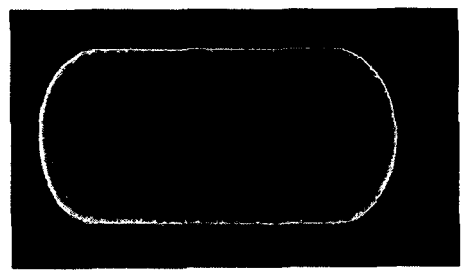
Fig. 3
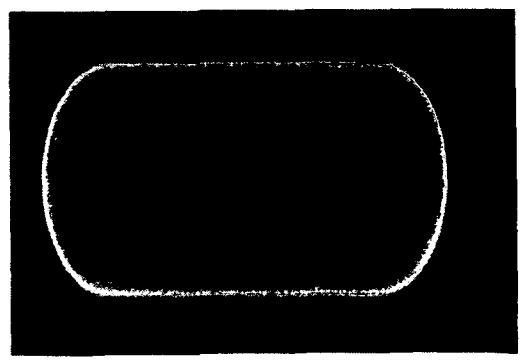

Citral diethyl acetal based OLED ink printed on the substrate at t=0s

Citral diethyl acetal based OLED ink printed on the substrate at t=39s

Limonene based OLED ink printed on the substrate at t=0s

Limonene based OLED ink printed on the substrate at t=41s

INK COMPOSITION OF AN ORGANIC FUNCTIONAL MATERIAL

CROSS-REFERENCE TO RELATED APPLICATIONS

This application is a national stage application (under 35 U.S.C. § 371) of PCT/EP2016/001994, filed Nov. 25, 2016, which claims benefit of European Application No. 15200459.4, filed Dec. 16, 2015, both of which are incorporated herein by reference in their entirety.

FIELD OF THE INVENTION

The present invention relates to an ink composition comprising an organic functional material having a molecular weight of at most 5,000 g/mol and a first organic solvent selected from the group consisting of terpene, terpenoid, and combination of any of these, as well as to the use of the ink composition, an electronic device prepared by using the ink composition and method for preparing/fabricating thereof.

BACKGROUND ART

Ink compositions including an organic functional material and solvent are variety used to fabricate an electronic device comprising an organic functional layer.

For example, as described in U.S. Pat. No. 7,166,664 B1, JP 2014/002292 A, WO 2001/16251 A1.

PATENT LITERATURE

1. U.S. Pat. No. 7,166,664 B1
2. JP 2014/002292 A
3. WO 2001/16251 A1

SUMMARY OF THE INVENTION

However, the inventors newly have found that there are still one or more of considerable problems for which improvement is desired, as listed below.
1. A novel ink composition comprising an organic functional material having the average molecular weight of at most 5,000 g/mol or less and an organic solvent which may lead to a better homogeneity of the ink on a substrate after printed is desired.
2. A novel ink composition comprising an organic functional material and an organic solvent in which preferably fits for printing process is required.
3. A novel ink composition comprising an organic functional material and an organic solvent which may lead to a better homogeneity of an organic functional layer fabricated onto a substrate is desired.
4. A novel ink composition comprising an organic functional material having an average molecular weight of at most 5,000 g/mol or less and an organic solvent, which can provide a good device performance is required.

The inventors aimed to solve the problems mentioned above. Surprisingly, the inventors have found a novel ink composition comprising at least one organic functional material having a molecular weight of at most 5,000 g/mol and at least a first organic solvent having a boiling point in the range from 200° C. to 320° C., wherein the first organic solvent is selected from the group consisting of terpenes, terpenoids, and a combination of thereof, solves all of the problems 1 to 4 at the same time.

In another aspect, the invention relates to the use of the ink composition in an electronic device fabrication process.

In another aspect, the invention further relates to a method for fabricating an electronic device, wherein the method comprises step (x) and step (y) in this sequence:

(x) printing the ink composition, onto a surface of one layer of the electronic device; and (y) drying the solvent.

In another aspect, the invention furthermore relates to an electronic device containing one functional layer comprising one organic functional material fabricated by the method step (x) and step (y) in this sequence:

(x) printing the ink composition, onto a surface of one layer of the electronic device; and (y) drying the solvent.

Further advantages of the present invention will become evident from the following detailed description.

DESCRIPTION OF DRAWINGS

FIG. 1: shows a cross sectional view of a schematic of one embodiment of an electronic device of the present invention.

FIGS. 2 to 10: show photoluminescent (PL) images of pixels prepared using ink compositions according to working examples 1 to 9.

DETAILED DESCRIPTION OF THE INVENTION

Figure 4:
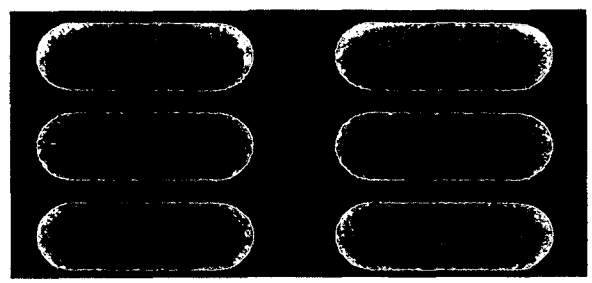

In one aspect of the present invention, ink composition comprising an organic functional material having a molecular weight at most 5,000 g/mol and a first organic solvent selected from the group consisting of terpenes, terpenoids, and a combination of any of these, wherein the boiling point of the first organic solvent at 1 atm is in the range from 200° C. to 320° C., is provided by the inventors to solve whole problems 1 to 4 at the same time.

Solvents According to the present invention, a wide variety of publically known terpene, and/or terpenoid solvents having the boiling point at 1 atm of the first organic solvent is in the range from 190° C. to 350° C. can be used as desired.

According to the present invention, the term "terpene" means an organic functional material having one or more of building blocks delivered from the hydrocarbon isoprene (2-methyl-1,3-butadiene), but which does preferably not contain a ketone group.

According to the present invention, the term "terpenoid" is taken to mean an organic functional material having one or more of building blocks delivered from the hydrocarbon isoprene and in addition containing at least one ketone group, preferably one ketone group.

In a preferred embodiment of the present invention, the terpenes comprise a unit of formula (I), and/or a unit of formula (III), and do not contain a unit of formula (II), a unit of formula (IV), and a unit of formula (V), wherein the terpenoids comprise at least one unit selected from the group consisting of a unit of formula (II), a unit of formula (IV), and a unit of formula (V)

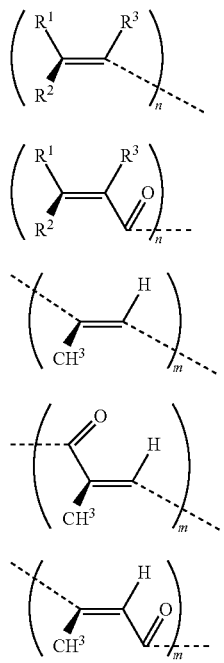

wherein,
$R^1$, $R^2$ and $R^3$ are, identically or differently at each occurrence, H or $CH_3$, and at least any one of $R^1$, $R^2$ and $R^3$ is $CH_3$; n is an integer of 1 to 2; m is an integer of 1 to 3; and the dashed lines are, each independently, a bond connected to a molecule.

In a preferred embodiment of the present invention, the terpenes comprise a unit of formula (I), and the terpenoids comprise a unit of formula (II)

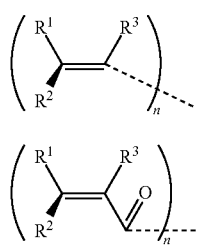

wherein, $R^1$, $R^2$ and $R^3$ are, identically or differently at each occurrence, H or $CH_3$, and at least any one of $R^1$, $R^2$ and $R^3$ is $CH_3$; n is an integer of 1 to 2; and the dashed line is a bond connected to a molecule.

In a preferred embodiment of the present invention, the terpenes comprise a unit of formula (III), and the terpenoids comprise a unit of formula (IV), or a unit of formula (V).

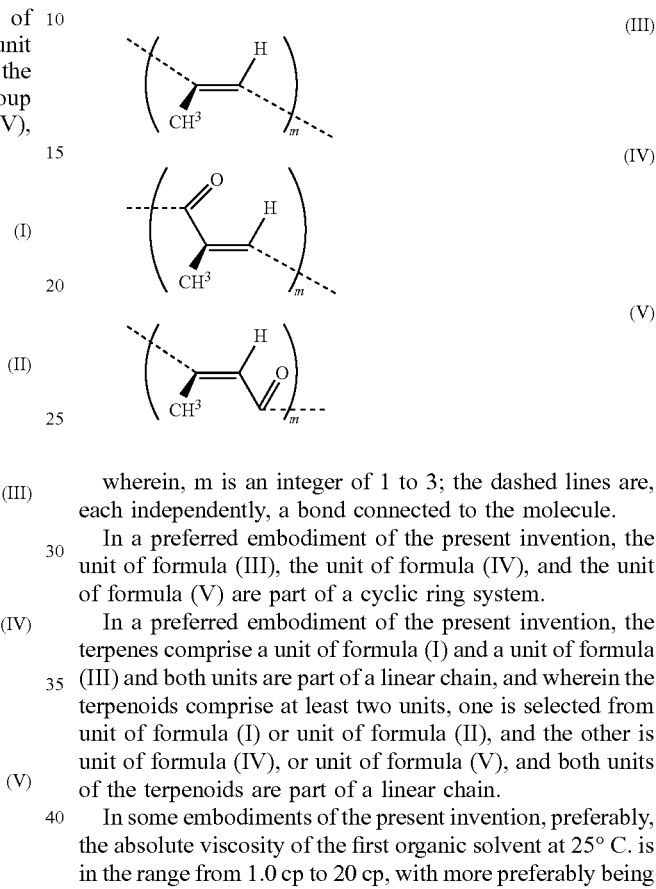

wherein, m is an integer of 1 to 3; the dashed lines are, each independently, a bond connected to the molecule.

In a preferred embodiment of the present invention, the unit of formula (III), the unit of formula (IV), and the unit of formula (V) are part of a cyclic ring system.

In a preferred embodiment of the present invention, the terpenes comprise a unit of formula (I) and a unit of formula (III) and both units are part of a linear chain, and wherein the terpenoids comprise at least two units, one is selected from unit of formula (I) or unit of formula (II), and the other is unit of formula (IV), or unit of formula (V), and both units of the terpenoids are part of a linear chain.

In some embodiments of the present invention, preferably, the absolute viscosity of the first organic solvent at 25° C. is in the range from 1.0 cp to 20 cp, with more preferably being in the range from 2.0 cp to 7.0 cp.

In some embodiments of the present invention, preferably, the surface tension of the first organic solvent at 25° C. is in the range from 24 dyne/cm to 70 dyne/cm, with more preferably being in the range from 27 dyne/cm to 40 dyne/cm.

According to the present invention, the solvents have lower toxicity. And without wishing to be bound by theory, it is believed that the solvents having the absolute viscosity, the boiling point, and the surface tension may lead to better ink layer uniformity when it is deposited, better layer properties of the organic functional material, and good device performances, such as device efficiency. And it is considered that the solvents of the present invention are especially suitable for inkjet printing use.

In some embodiments of the present invention, preferably, the first solvent can be selected from the group consisiting of valencene, β-Caryophyllene, D-carvone, Citral diethyl acetal, Verbenone, Nerol, Menthone, Citral, derivatives thereof, and a combination of any of these.

According to the present invention, the term "derivative" includes cis- and trans isomers.

Examples of the preferred solvents and their physical parameters are shown in Table 1.

TABLE 1

| Solvents | Viscosity (cp) @25° C. | Surface tension (dyne/cm) | Boiling point (° C.) |
| --- | --- | --- | --- |
| β-Caryophyllene, CAS: 87-44-5 | 6.9 | 29.7 | 260 |
| Valencene, CAS: 4630-07-3 | 5.3 | 29.7 | 274 |
| D-carvone (including R-carvone and S-carvone), CAS: 2244-16-8 | 2.3 | 34.8 | 225 |
| Citral diethyl acetal, CAS: 7549-37-3 | 2.4 | 27.2 | 271 |
| Verbenone, CAS: 1196-01-6 | 4.7 | 29.5 | 227 |
| Nerol, CAS: 106-25-2 | 5.7 | 29.0 | 224 |
| Citral, CAS: 5392-40-5 | 2.2 | 34.1 | 229 |

In some embodiments of the present invention, the ink composition can further comprise a second organic solvent which is different from the first organic solvent.

Suitable second organic solvents according to the present invention are preferably organic solvents which include inter alia, alcohols, aldehydes, ketones, ethers, esters, amides such as di-$C_{1-2}$-alkylformamides, sulfur compounds, nitro compounds, hydrocarbons, halogenated hydrocarbons (e.g. chlorinated hydrocarbons), aromatic or heteroaromatic hydrocarbons and halogenated aromatic or heteroaromatic hydrocarbons.

Preferably, the second solvent can be chosen from one of the following groups: substituted and non-substituted aromatic or linear esters such as ethyl benzoate, butyl benzoate; substituted and non-substituted aromatic or linear ethers such as 3-phenoxytoluene or anisole; substituted or non-substituted arene derivatives such as xylene; indane derivatives such as hexamethylindane; substituted and non-substituted aromatic or linear ketones; substituted and non-substituted heterocycles such as pyrrolidinones, pyridines, pyrazines; other fluorinated or chlorinated aromatic hydrocarbons.

Particularly preferred second organic solvents are, for example, 1,2,3,4-tetramethylbenzene, 1,2,3,5-tetramethylbenzene, 1,2,3-trimethylbenzene, 1,2,4,5-tetramethylbenzene, 1,2,4-trichlorobenzene, 1,2,4-trimethylbenzene, 1,2-dihydronaphthalene, 1,2-dimethylnaphthalene, 1,3-benzodioxolane, 1,3-diisopropylbenzene, 1,3-dimethylnaphthalene, 1,4-benzo-dioxane, 1,4-diisopropylbenzene, 1,4-dimethylnaphthalene, 1,5-dimethyl-tetralin, 1-benzothiophene, thianaphthalene, 1-bromonaphthalene, 1-chloro-methylnaphthalene, 1-ethylnaphthalene, 1-methoxynaphthalene, 1-methylnaphthalene, 1-methylindole, 2,3-benzofuran, 2,3-dihydrobenzo-furan, 2,3-dimethylanisole, 2,4-dimethylanisole, 2,5-dimethylanisole, 2,6-dimethylanisole, 2,6-dimethylnaphthalene, 2-bromo-3-bromomethylnaphthalene, 2-bromomethylnaphthalene, 2-bromonaphthalene, 2-ethoxynaph-thalene, 2-ethylnaphthalene, 2-isopropylanisole, 2-methylanisole, 2-methylindole, 3,4-dimethylanisole, 3,5-dimethylanisole, 3-bromoquinoline, 3-methylanisole, 4-methylanisole, 5-decanolide, 5-methoxyindane, 5-methoxyindole, 5-tert-butyl-m-xylene, 6-methyl-quinoline, 8-methylquino-line, acetophenone, anisole, benzonitrile, benzothiazole, benzyl acetate, bromobenzene, butyl benzoate, butyl phenyl ether, cyclohexylbenzene, decahydronaphthol, dimethoxytoluene, 3-phenoxytoluene, diphenyl ether, propiophenone, ethylbenzene, ethyl benzoate, γ-terpine, hexylbenzene, indane, hexamethylindane, indene, isochroman, cumene, m-cymene, mesitylene, methyl benzoate, o-, m-, p-xylene, propyl benzoate, propylbenzene, o-dichlorobenzene, pentylbenzene, phenetol, ethoxybenzene, phenyl acetate, p-cymene, propiophenone, sec-butylbenzene, t-butylbenzene, thiophene, toluene, veratrol, monochlorobenzene, o-dichlorobenzene, pyridine, pyrazine, pyrimidine, pyrrolidinone, morpholine, dimethylacetamide, dimethyl sulfoxide, decalin and/or mixtures of these compounds.

These solvents can be employed individually or as a mixture of two, three or more solvents forming the second solvent.

Preferably, the second solvent has a boiling point in the range from 190 to 350° C., more preferably in the range from 200 to 320° C.

In a preferred embodiment of the present invention, the second solvent has an absolute viscosity in the range from 0.7 cp to 20 cp at 25° C., more preferably in the range from 1.0 cp to 8.0 cp.

Preferably, the second solvent has a liquid surface tension in the range from 24 dyne/cm to 70 dyne/cm at 25° C., more preferably, it is in the range from 27 dyne/cm to 50 dyne/cm.

The surface tension of the ink composition and solvents are measured by pendant drop characterization which is an optical method. This measurement technique dispenses a drop from a needle in a bulk liquid or gaseous phase. The shape of the drop results from the relationship between the surface tension, gravity and density differences. Using the pendant drop method, the surface tension is calculated from the shadow image of a pendant drop using drop shape analysis. A commonly used and commercially available high precision drop shape analysis tool, namely FTA1000 from First Ten Angstrom, was used to perform all surface tension measurements. The surface tension is determined by the software FTA1000. All measurements were performed at room temperature which is in the range between 22° C. and 24° C. The standard operating procedure includes the determination of the surface tension of each ink composition and/or solvent using a fresh disposable drop dispensing system (syringe and needle). Each drop is measured over the duration of one minute with sixty measurements which are later on averaged. For each ink composition and/or solvent three drops are measured. The final value is averaged over said measurements. The tool is regularly cross-checked against various liquids having well known surface tension.

The viscosity of the ink compositions and solvents according to the present invention is measured with a 1° cone-plate rotational rheometer of the type Discovery AR3 (Thermo Scientific). The equipment allows a precise control of the temperature and sheer rate. The measurement of the viscosity is carried out at a temperature of 25.0° C. (+/−0.2° C.) and a sheer rate of 500 s$^{-1}$. Each sample is measured three times and the obtained measured values are averaged.

Organic Functional Materials

According to the present invention, the ink composition comprises an organic functional material having a molecular weight at most 5,000 g/mol. Molecular weight can be determine by mass spectroscopy.

In some embodiments of the present invention, preferably, the molecular weight of the organic functional material is in the range from 300 g/mol to 3,000 g/mol, with more preferably being in the range from 500 g/mol to 2,500 g/mol.

According to the present invention, without wishing to be bound by theory, it is believed that the organic functional materials having a molecular weight at most 5,000 g/mol, preferably, the molecular weight of the organic functional material is in the range from 300 g/mol to 3,000 g/mol, with more preferably being in the range from 500 g/mol to 2,500 g/mol, may lead to better ink layer uniformity when it is mixed with the solvent of the present invention and when the ink composition is deposited, better layer properties of the organic functional material, and good device performances, such as device efficiency due to lower viscosity of the organic functional materials.

Furthermore, it is considered that the materials of the present invention are especially suitable for inkjet printing use.

In some embodiments of the present invention, preferably, the content of the organic functional material in the ink composition is in the range from 0.0001 wt. % to 20 wt. % based on the total weight of the ink composition. More preferably, it is in the range from 0.001 wt. % to 10 wt. %, most preferably, in the range from 0.01 wt. % to 5 wt. % based on the total weight of the ink composition.

In some embodiments of the present invention, preferably, the organic functional material is selected from the group consisiting of organic conductors, organic semiconductors, organic fluorescent compounds, organic phosphorescent compounds, organic light-absorbent compounds, organic light-sensitive compounds, organic photosensitisation agents and other organic photoactive compounds such as organometallic complexes of transition metals, rare earths, lanthanides, actinides and a combination of any of these.

In some embodiments, preferably, the organic functional material is selected from the group consisting of fluorescent emitters, phosphorescent emitters, host materials, matrix materials, exciton-blocking materials, electron-transport materials, electron-injection materials, hole-conductor materials, hole-injection materials, negative type organic dopants, positive type organic dopants, wide-band-gap materials, electron-blocking materials, hole-blocking materials and a combination of any of these.

In a preferred embodiment, the organic functional material is selected from the group consisting of fluorescent emitters, phosphorescent emitters, host materials, hole-injecting materials, hole-transporting materials, electron-transporting materials and electron-injecting materials and a combination of any of these.

More preferably, the organic functional material is selected from the group consisting of phosphorescent emitters, host materials hole-injecting materials and hole-transporting materials and a combination of any of these.

The organic functional material can be a compound having a molecular weight at most 5,000 g/mol, where the organic functional material may also be in the form of a mixture. Thus, the ink compositions according to the present invention may comprise two different compounds having a molecular weight at most 5,000 g/mol (blend).

Organic functional materials are frequently described via the properties of the frontier orbitals, which are described in greater detail below. Molecular orbitals, in particular also the highest occupied molecular orbital (HOMO) and the lowest unoccupied molecular orbital (LUMO), their energy levels and the energy of the lowest triplet state $T_1$ or of the lowest excited singlet state $S_1$ of the materials are determined via quantum-chemical calculations. In order to calculate organic substances without metals, firstly a geometry optimisation is carried out using the "Ground State/Semi-empirical/Default Spin/AM1/Charge 0/Spin Singlet" method. An energy calculation is subse-quently carried out on the basis of the optimised geometry. The "TD-SCF/DFT/Default Spin/B3PW91" method with the "6-31G (d)" base set (charge 0, spin singlet) is used here. For metal-containing compounds, the geometry is optimised via the "Ground State/Hartree-Fock/Default Spin/LanL2MB/Charge 0/Spin Singlet" method. The energy calculation is carried out analogously to the above-described method for the organic substances, with the difference that the "LanL2DZ" base set is used for the metal atom and the "6-31G (d)" base set is used for the ligands. The energy calculation gives the HOMO energy level HEh or LUMO energy level LEh in hartree units. The HOMO and LUMO energy levels in electron volts calibrated with reference to cyclic voltammetry measurements are determined therefrom as follows:

HOMO(eV)=((HEh*27.212)−0.9899)/1.1206

LUMO(eV)=((LEh*27.212)−2.0041)/1.385

For the purposes of the present application, these values are to be regarded as HOMO and LUMO energy levels respectively of the materials.

The lowest triplet state $T_1$ is defined as the energy of the triplet state having the lowest energy which arises from the quantum-chemical calculation described.

The lowest excited singlet state $S_1$ is defined as the energy of the excited singlet state having the lowest energy which arises from the quantum-chemical calculation described.

The method described herein is independent of the software package used and always gives the same results. Examples of frequently used programs for this purpose are "Gaussian09W" (Gaussian Inc.) and Q-Chem 4.1 (Q-Chem, Inc.).

Compounds having hole-injection properties, also called hole-injection materials herein, simplify or facilitate the transfer of holes, i.e. positive charges, from the anode into an organic layer. In general, a hole-injection material has an HOMO level which is in the region of or above the level of the anode, i.e. in general is at least −5.3 eV.

Compounds having hole-transport properties, also called hole-transport materials herein, are capable of transporting holes, i.e. positive charges, which are generally injected from the anode or an adjacent layer, for example a hole-injection layer. A hole-transport material generally has a high HOMO level of preferably at least −5.4 eV. Depending on the structure of an electronic device, it may also be possible to employ a hole-transport material as hole-injection material.

The preferred compounds which have hole-injection and/or hole-transport properties include, for example, triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital).

As compounds which have hole-injection and/or hole-transport properties, particular mention may be made of phenylenediamine derivatives (U.S. Pat. No. 3,615,404), arylamine derivatives (U.S. Pat. No. 3,567,450), amino-substituted chalcone derivatives (U.S. Pat. No. 3,526,501), styrylanthracene derivatives (JP-A-56-46234), polycyclic aromatic compounds (EP 1009041), polyarylalkane derivatives (U.S. Pat. No. 3,615,402), fluorenone derivatives (JP-A-54-110837), hydrazone derivatives (U.S. Pat. No. 3,717,462), acylhydrazones, stilbene derivatives (JP-A-61-210363), silazane derivatives (U.S. Pat. No. 4,950,950), and other electrically conducting macromolecules, porphyrin compounds (JP-A-63-2956965, U.S. Pat. No. 4,720,432), aromatic dimethylidene-type compounds, carbazole compounds, such as, for example, CDBP, CBP, mCP, aromatic tertiary amine and styrylamine compounds (U.S. Pat. No. 4,127,412), such as, for example, triphenylamines of the benzidine type, triphenylamines of the styrylamine type and triphenylamines of the diamine type. It is also possible to use arylamine dendrimers (JP Heisei 8 (1996) 193191), monomeric triarylamines (U.S. Pat. No. 3,180,730), triarylamines containing one or more vinyl radicals and/or at least one functional group containing active hydrogen (U.S. Pat. Nos. 3,567,450 and 3,658,520), or tetraaryldiamines (the two tertiary amine units are connected via an aryl group). More triarylamino groups may also be present in the molecule. Phthalocyanine derivatives, naphthalocyanine derivatives, butadiene derivatives and quinoline derivatives, such as, for example, dipyrazino[2,3-f:2',3'-h]quinoxalinehexacarbo-nitrile, are also suitable.

Preference is given to aromatic tertiary amines containing at least two tertiary amine units (US 2008/0102311 A1, U.S.

Pat. Nos. 4,720,432 and 5,061,569), such as, for example, NPD (α-NPD=4,4'-bis[N-(1-naphthyl)-N-phenylamino]biphenyl) (U.S. Pat. No. 5,061,569), TPD 232 (=N,N'-bis-(N,N'-diphenyl-4-aminophenyl)-N,N-diphenyl-4,4'-diamino-1,1'-biphenyl) or MTDATA (MTDATA or m-MTDATA=4,4',4"-tris[3-methylphenyl)phenylamino]-triphenylamine) (JP-A-4-308688), TBDB (=N,N,N',N'-tetra(4-biphenyl)-diaminobiphenylene), TAPC(=1,1-bis(4-di-p-tolylaminophenyl)cyclo-hexane), TAPPP (=1,1-bis(4-di-p-tolylaminophenyl)-3-phenylpropane), BDTAPVB (=1,4-bis[2-[4-[N,N-di(p-tolyl)amino]phenyl]vinyl]benzene), TTB (=N,N,N',N'-tetra-p-tolyl-4,4'-diaminobiphenyl), TPD (=4,4'-bis[N-3-methylphenyl]-N-phenylamino)biphenyl), N,N,N',N'-tetraphenyl-4,4'''-diamino-1,1',4',1'',4'',1'''-quaterphenyl, likewise tertiary amines containing carbazole units, such as, for example, TCTA (=4-(9H-carbazol-9-yl)-N,N-bis[4-(9H-carbazol-9-yl)phenyl]benzenamine). Preference is likewise given to hexa-azatriphenylene compounds in accordance with US 2007/0092755 A1 and phthalocyanine derivatives (for example H2Pc, CuPc (=copper phthalocyanine), CoPc, NiPc, ZnPc, PdPc, FePc, MnPc, ClAlPc, ClGaPc, ClInPc, ClSnPc, Cl₂SiPc, (HO)AlPc, (HO)GaPc, VOPc, TiOPc, MoOPc, GaPc-O-GaPc).

Particular preference is given to the following triarylamine compounds of the formulae (TA-1) to (TA-12), which are disclosed in the documents EP 1162193 B1, EP 650 955 B1, Synth. Metals 1997, 91(1-3), 209, DE 19646119 A1, WO 2006/122630 A1, EP 1 860 097 A1, EP 1834945 A1, JP 08053397 A, U.S. Pat. No. 6,251,531 B1, US 2005/0221124, JP 08292586 A, U.S. Pat. No. 7,399,537 B2, US 2006/0061265 A1, EP 1 661 888 and WO 2009/041635. The said compounds of the formulae (TA-1) to (TA-12) may also be substituted:

formula TA-1

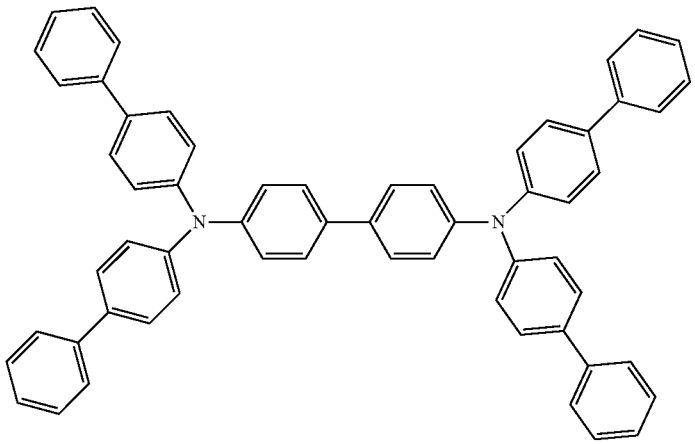

formula TA-2

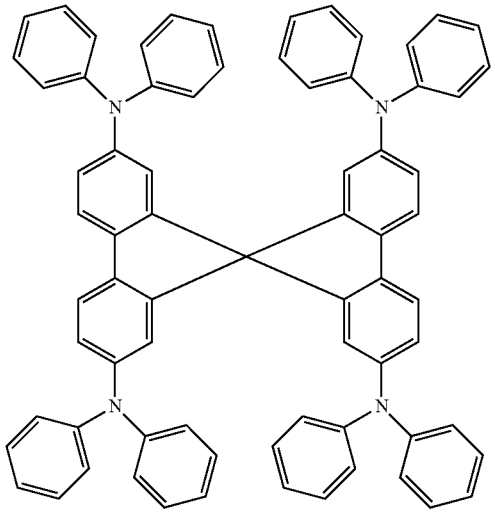

formula TA-3

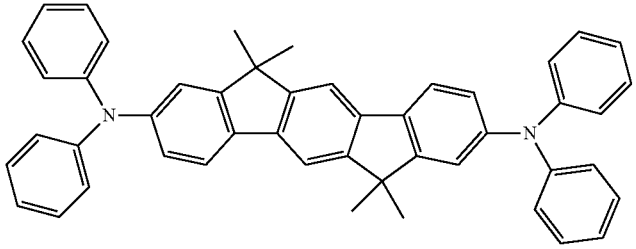

-continued
formula TA-4
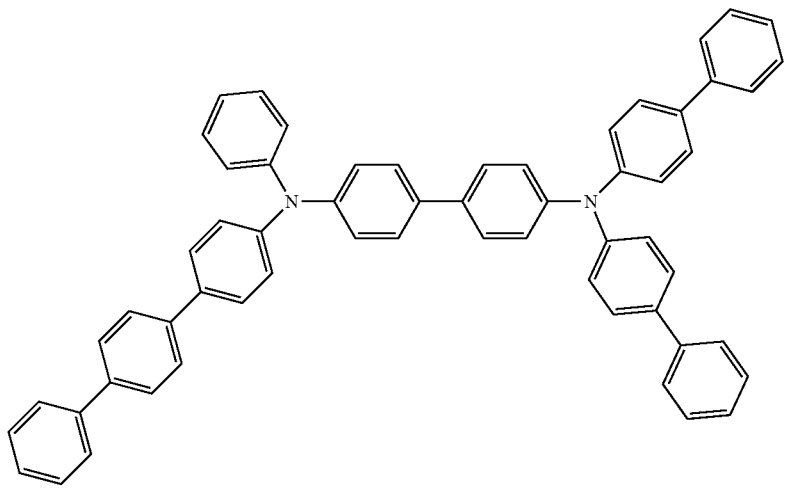
formula TA-5
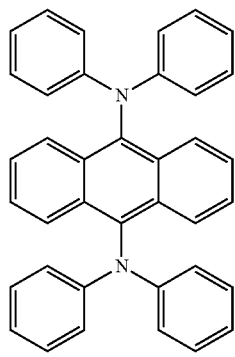
formula TA-6
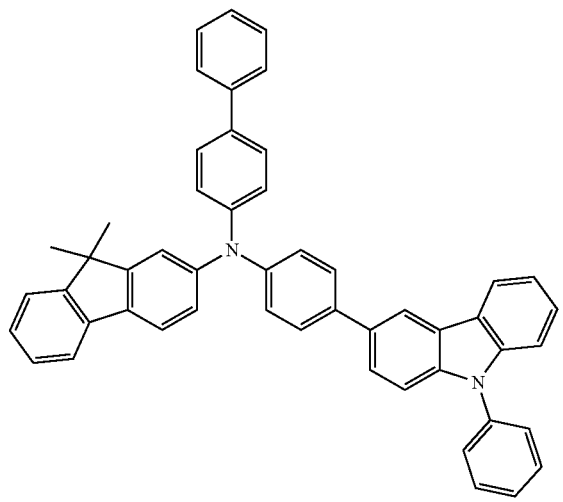
formula TA-7
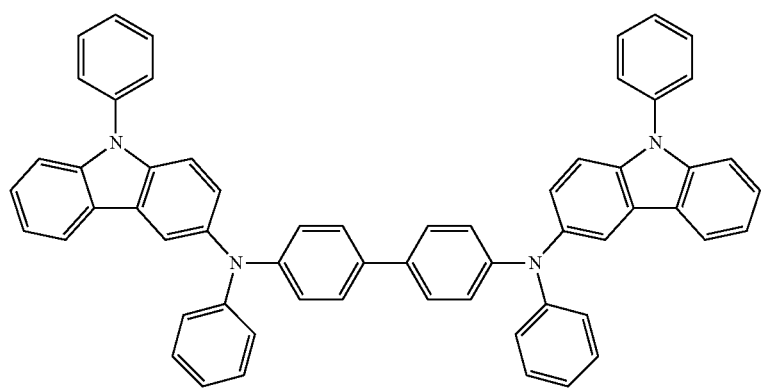

-continued
formula TA-8
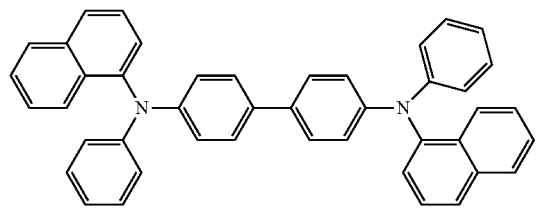
NPB = alpha-NPD
formula TA-9
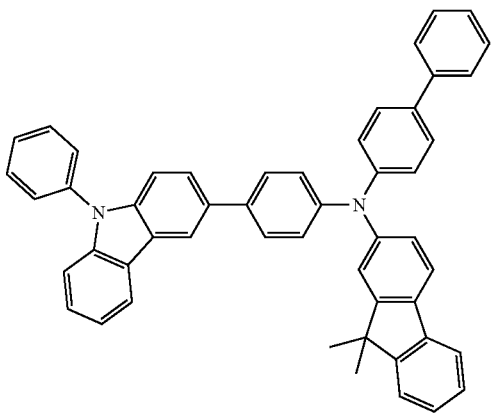
formula TA-10
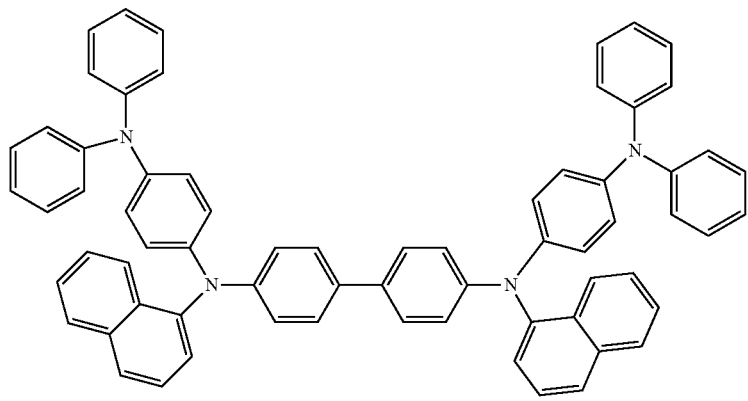
formula TA-11
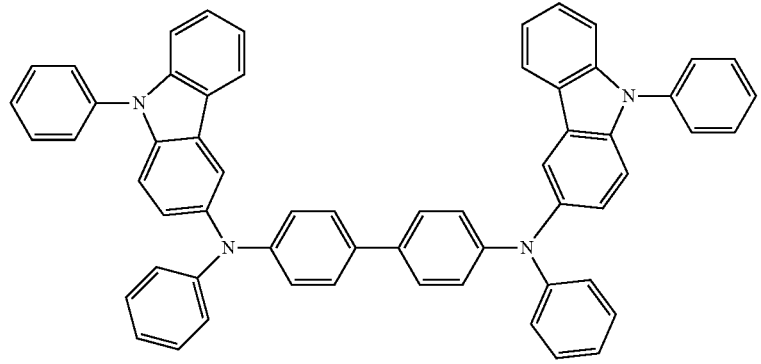

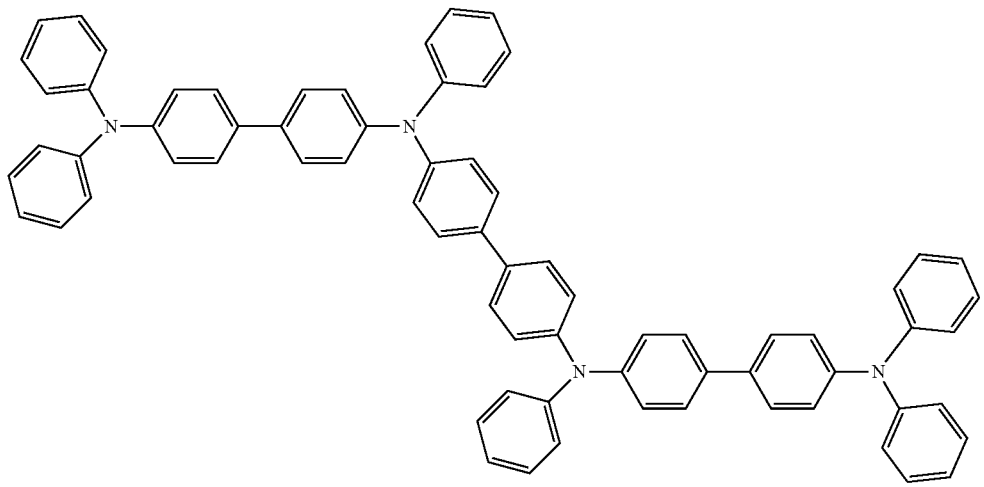

formula TA-12

Further compounds which can be employed as hole-injection materials are described in EP 0891121 A1 and EP 1029909 A1, injection layers in general in US 20040174116 A1.

Compounds which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital).

Particularly suitable compounds for electron-transporting and electron-injecting layers are metal chelates of 8-hydroxyquinoline (for example LiQ, AlQ$_3$, GaQ$_3$, MgQ$_2$, ZnQ$_2$, InQ$_3$, ZrQ$_4$), BAlQ, Ga oxinoid complexes, 4-azaphenanthren-5-ol-Be complexes (U.S. Pat. No. 5,529,853 A, cf. formula ET-1), butadiene derivatives (U.S. Pat. No. 4,356,429), heterocyclic optical brighteners (U.S. Pat. No. 4,539,507), benzimidazole derivatives (US 2007/0273272 A1), such as, for example, TPBI (U.S. Pat. No. 5,766,779, cf. formula ET-2), 1,3,5-triazines, for example spirobifluorenyltriazine derivatives (for example in accordance with DE 102008064200), pyrenes, anthracenes, tetracenes, fluorenes, spiro-fluorenes, dendrimers, tetracenes (for example rubrene derivatives), 1,10-phenanthroline derivatives (JP 2003-115387, JP 2004-311184, JP-2001-267080, WO 02/043449), silacyclopentadiene derivatives (EP 1480280, EP 1478032, EP 1469533), borane derivatives, such as, for example, tri-arylborane derivatives containing Si (US 2007/0087219 A1, cf. formula ET-3), pyridine derivatives (JP 2004-200162), phenanthrolines, especially 1,10-phenanthroline derivatives, such as, for example, BCP and Bphen, also several phenanthrolines connected via biphenyl or other aromatic groups (US-2007-0252517 A1) or phenanthrolines connected to anthracene (US 2007-0122656 A1, cf. formulae ET-4 and ET-5).

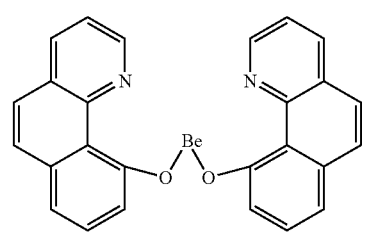

formula ET-1

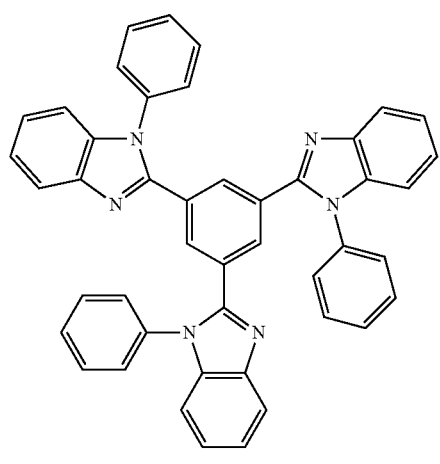

formula ET-2

TPBI
2,2′,2″-(1,3,5-benzenetriyl)tris(1-phenyl-1H-benzimidazole)

formula ET-3

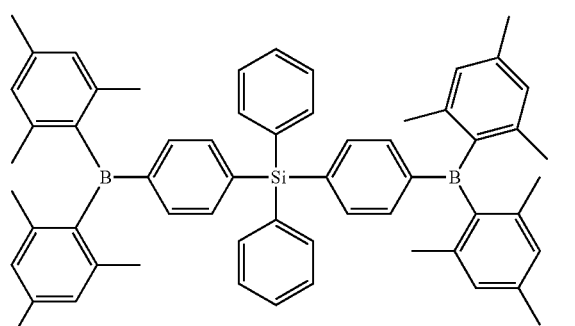

formula ET-4

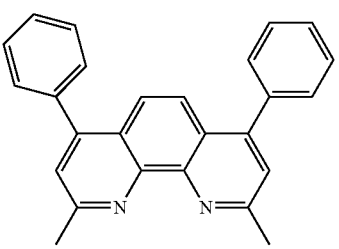

formula ET-5

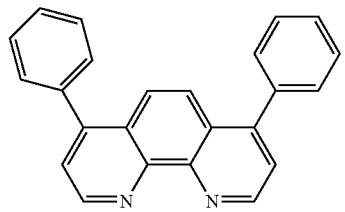

Likewise suitable are heterocyclic organic compounds, such as, for example, thiopyran dioxides, oxazoles, triazoles, imidazoles or oxadiazoles. Examples of the use of five-membered rings containing N, such as, for example, oxazoles, preferably 1,3,4-oxadiazoles, for example compounds of the formulae ET-6, ET-7, ET-8 and ET-9, which are disclose, inter alia, in US 2007/0273272 A1; thiazoles, oxadiazoles, thiadiazoles, triazoles, inter alia, see US 2008/0102311 A1 and Y. A. Levin, M. S. Skorobogatova, Khimiya Geterotsiklicheskikh Soedinenii 1967 (2), 339-341, preferably compounds of the formula ET-10, silacyclopentadiene derivatives. Preferred compounds are the following of the formulae (ET-6) to (ET-10):

formula ET-6

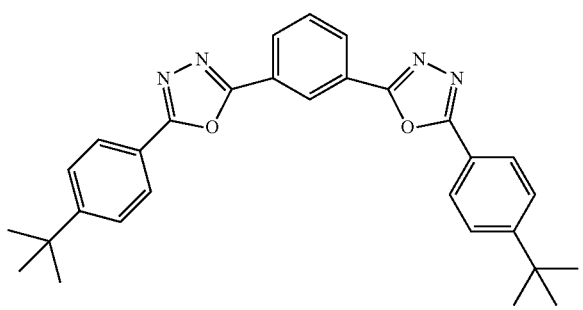

formula ET-7

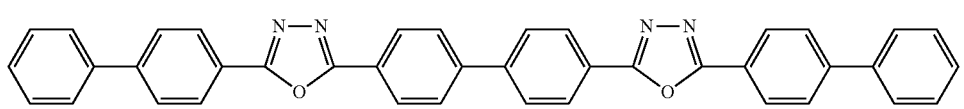

formula ET-8

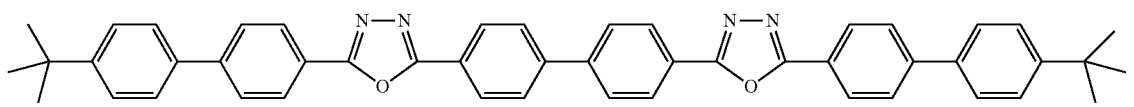

formula ET-9

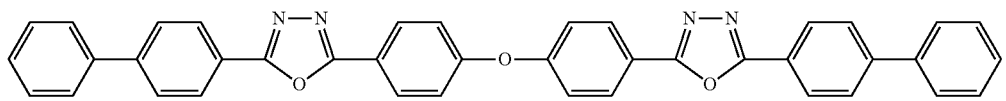

formula ET-10

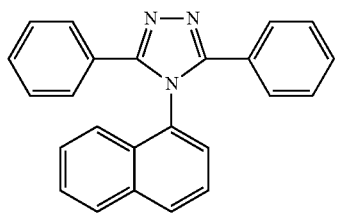

It is also possible to employ organic compounds, such as derivatives of fluorenone, fluorenylidenemethane, perylenetetracarbonic acid, anthra-quinonedimethane, diphenoquinone, anthrone and anthraquinone-diethylenediamine.

Preference is given to 2,9,10-substituted anthracenes (with 1- or 2-naphthyl and 4- or 3-biphenyl) or molecules which contain two anthracene units (US2008/0193796 A1, cf. formula ET-11). Also very advantageous is the connection of 9,10-substituted anthracene units to benzimidazole derivatives (US 2006 147747 A and EP 1551206 A1, cf. formulae ET-12 and ET-13).

formula ET-11

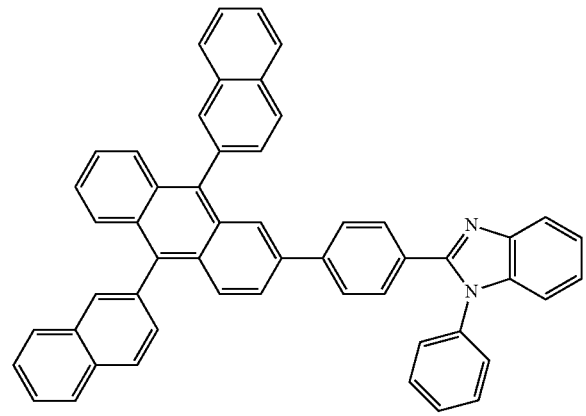

formula ET-12

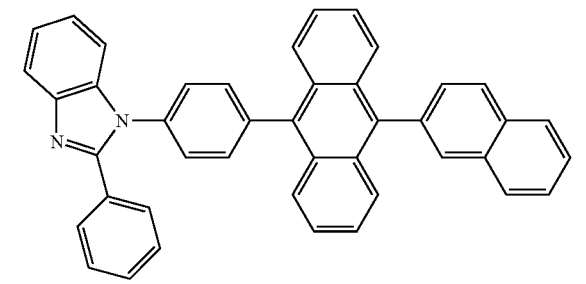

formula ET-13

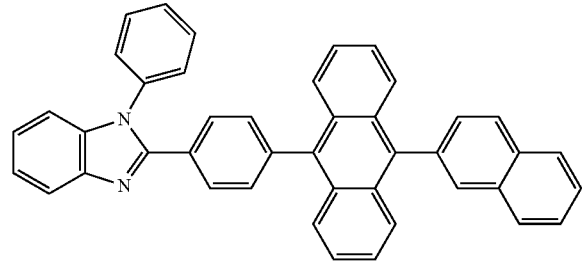

The compounds which are able to generate electron-injection and/or electron-transport properties preferably result in an LUMO of less than −2.5 eV (vs. vacuum level), particularly preferably less than −2.7 eV.

The present ink compositions may comprise emitters. The term emitter denotes a material which, after excitation, which can take place by transfer of any type of energy, allows a radiative transition into a ground state with emission of light. In general, two classes of emitter are known, namely fluorescent and phosphorescent emitters.

According to the present invention, the term "fluorescent emitter" denotes materials or compounds in which a radiative transition from an excited singlet state into the ground state takes place.

And the term "phosphorescent emitter", according to the invention, preferably taken to mean luminescent materials or compounds which contain transition metals.

Emitters are frequently also called dopants if the dopants cause the properties described above in a system. A dopant in a system comprising a matrix material and a dopant is taken to mean the component whose proportion in the mixture is the smaller. Correspondingly, a matrix material in a system comprising a matrix material and a dopant is taken to mean the component whose proportion in the mixture is the greater. Accordingly, the term "phosphorescent emitter" can also be taken to mean, for example, phosphorescent dopants.

Compounds which are able to emit light include, inter alia, fluorescent emitters and phosphorescent emitters. These include, inter alia, compounds containing stilbene, stilbenamine, styrylamine, coumarine, rubrene, rhodamine, thiazole, thiadiazole, cyanine, thiophene, paraphenylene, perylene, phtalocyanine, porphyrin, ketone, quinoline, imine, anthracene and/or pyrene structures. Particular preference is given to compounds which are able to emit light from the triplet state with high efficiency, even at room temperature, i.e. exhibit electrophosphorescence instead of electro-fluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding compounds which contain elements from group 8 to 10 (Ru, Os, Rh, Ir, Pd, Pt). Suitable functional compounds here are, for example, various complexes, as described, for example, in WO 02/068435 A1, WO 02/081488 A1, EP 1239526 A2 and WO 2004/026886 A2.

Preferred compounds which can serve as fluorescent emitters are described by way of example below. Preferred fluorescent emitters are selected from the class of the monostyrylamines, the distyrylamines, the tristyrylamines, the tetrastyrylamines, the styrylphosphines, the styryl ethers and the arylamines.

A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stil-benes, which may also be further substituted. Corresponding phosphines and ethers are defined analogously to the amines. An arylamine or an aromatic amine in the sense of the present invention is taken to mean a compound which contains three substituted or unsubstituted aromatic or heteroaromatic ring systems bonded directly to the nitrogen. At least one of these aromatic or heteroaromatic ring systems is preferably a condensed ring system, preferably having at least 14 aromatic ring atoms. Preferred examples thereof are aromatic anthracenamines, aromatic anthracene-diamines, aromatic pyrenamines, aromatic pyrenediamines, aromatic chrysenamines or aromatic chrysene-diamines. An aromatic anthracen-amine is taken to mean a compound in which one diarylamino group is bonded directly to an anthracene group, preferably in the 9-position. An aromatic anthracene-diamine is taken to mean a compound in which two diarylamino groups are bonded directly to an anthracene group, preferably in the 2,6- or 9,10-position. Aromatic pyrenamines, pyrenediamines, chrysenamines and chrysenediamines are defined analogously thereto, where the diarylamino groups are preferably bonded to the pyrene in the 1-position or in the 1,6-position.

Further preferred fluorescent emitters are selected from indenofluorenamines or indenofluorenediamines, which are described, inter alia, in WO 2006/122630; benzoindenofluorenamines or benzoindenofluorenedi-amines, which are described, inter alia, in WO 2008/006449; and dibenzoindenofluorenamines or dibenzoindenofluorenediamines, which are described, inter alia, in WO 2007/140847.

Examples of compounds from the class of the styrylamines which can be employed as fluorescent emitters are substituted or unsubstituted tristilben-amines or the dopants described in WO 2006/000388, WO 2006/058737, WO 2006/000389, WO 2007/065549 and WO 2007/115610. Distyryl-benzene and distyrylbiphenyl derivatives are described in U.S. Pat. No. 5,121,029. Further styrylamines can be found in US 2007/0122656 A1.

Particularly preferred styrylamine compounds are the compounds of the formula EM-1 described in U.S. Pat. No. 7,250,532 B2 and the compounds of the formula EM-2 described in DE 10 2005 058557 A1:

formula EM-1

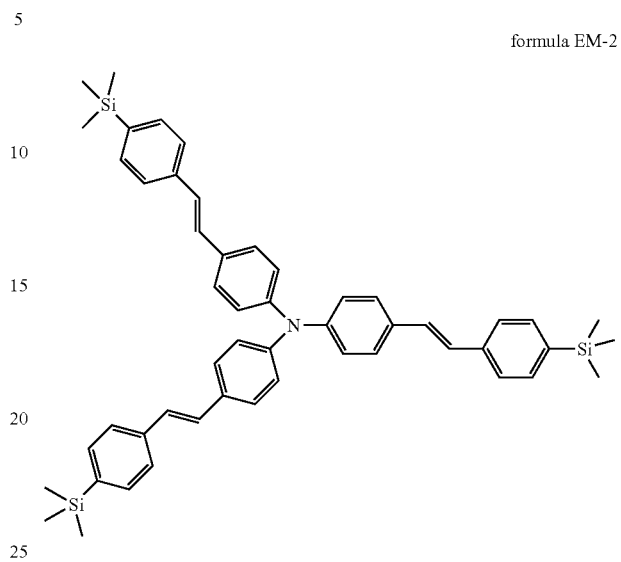

formula EM-2

Particularly preferred triarylamine compounds are compounds of the formulae EM-3 to EM-15 disclosed in CN 1583691 A, JP 08/053397 A and U.S. Pat. No. 6,251,531 B1, EP 1957606 A1, US 2008/0113101 A1, US 2006/210830 A, WO 2008/006449 and DE 102008035413 and derivatives thereof:

formula EM-3 formula EM-4

-continued
formula EM-5
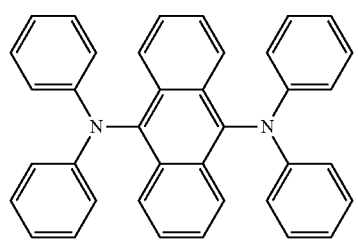
formula EM-6
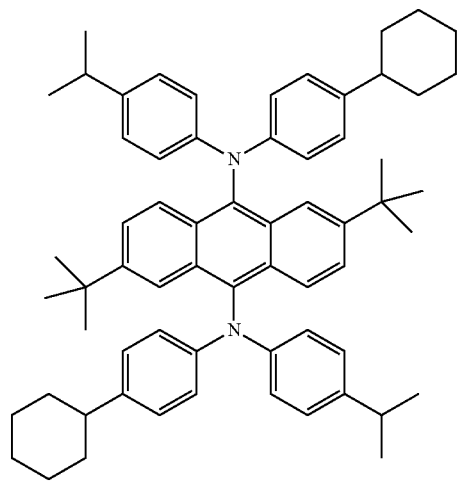
formula EM-7
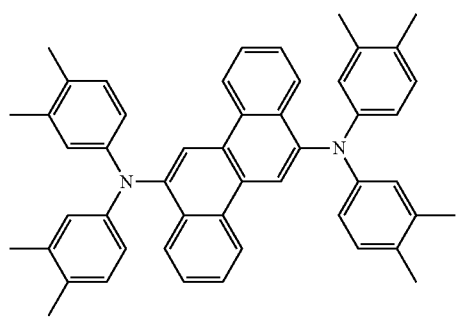
formula EM-8
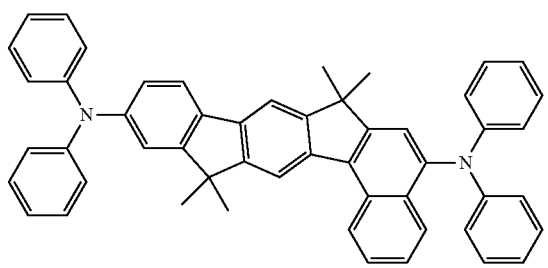
formula EM-9
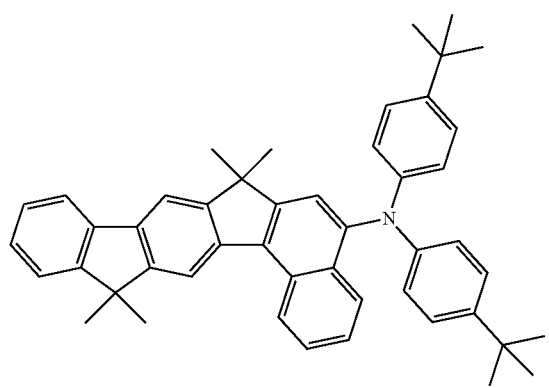

-continued formula EM-10

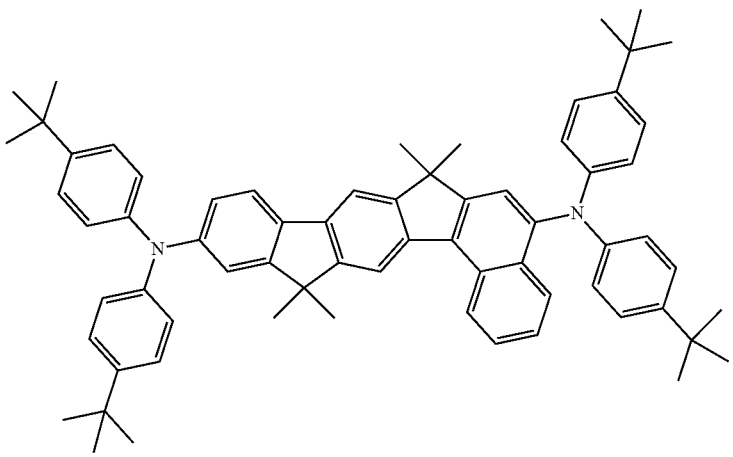

formula EM-11

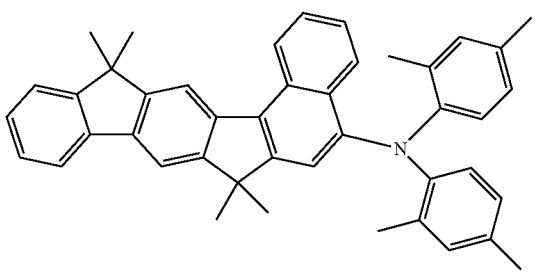

formula EM-12

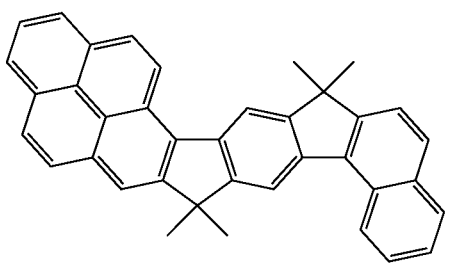

formula EM-13

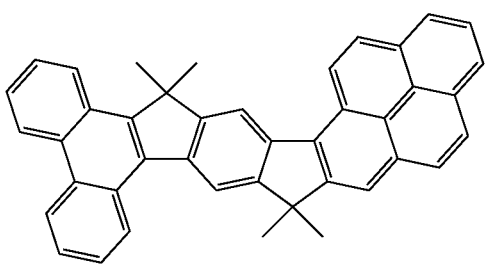

formula EM-14 formula EM-15

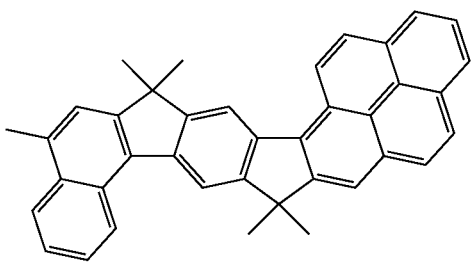

Further preferred compounds which can be employed as fluorescent emitters are selected from derivatives of naphthalene, anthracene, tetracene, benzanthracene, benzophenanthrene (DE 10 2009 005746), fluorene, fluoranthene, periflanthene, indenoperylene, phenanthrene, perylene (US 2007/0252517 A1), pyrene, chrysene, decacyclene, coronene, tetraphenylcyclopentadiene, pentaphenylcyclopentadiene, fluorene, spirofluorene, rubrene, coumarine (U.S. Pat. Nos. 4,769,292, 6,020,078, US 2007/0252517 A1), pyran, oxazole, benzoxazole, benzothiazole, benzimidazole, pyrazine, cinnamic acid esters, diketopyrrolopyrrole, acridone and quinacridone (US 2007/0252517 A1).

Of the anthracene compounds, particular preference is given to 9,10-substituted anthracenes, such as, for example, 9,10-diphenylanthracene and 9,10-bis(phenylethynyl)anthracene. 1,4-Bis(9'-ethynylanthracenyl)-benzene is also a preferred dopant.

Preference is likewise given to derivatives of rubrene, coumarine, rhodamine, quinacridone, such as, for example, DMQA (=N,N'-dimethylquinacri-done), dicyanomethylenepyran, such as, for example, DCM (=4-(dicyano-ethylene)-6-(4-dimethylaminostyryl-2-methyl)-4H-pyran), thiopyran, polymethine, pyrylium and thiapyrylium salts, periflanthene and indenoperylene.

Blue fluorescent emitters are preferably polyaromatic compounds, such as, for example, 9,10-di(2-naphthylanthracene) and other anthracene derivatives, derivatives of tetracene, xanthene, perylene, such as, for example, 2,5,8,11-tetra-t-butylperylene, phenylene, for example 4,4'-bis(9-ethyl-3-carbazovinylene)-1,1'-biphenyl, fluorene, fluoranthene, arylpyrenes (US 2006/0222886 A1), arylenevinylenes (U.S. Pat. Nos. 5,121,029, 5,130,603), bis-(azinyl)imine-boron compounds (US 2007/0092753 A1), bis (azinyl)methene compounds and carbostyryl compounds.

Further preferred blue fluorescent emitters are described in C. H. Chen et al.: "Recent developments in organic electroluminescent materials" Macro-mol. Symp. 125, (1997) 1-48 and "Recent progress of molecular organic electroluminescent materials and devices" Mat. Sci. and Eng. R, 39 (2002), 143-222.

Further preferred blue-fluorescent emitters are the hydrocarbons disclosed in DE 102008035413 A.

Preferred compounds which can serve as phosphorescent emitters are described below by way of example.

Examples of phosphorescent emitters are revealed by WO 00/70655 A, WO 01/41512 A, WO 02/02714 A, WO 02/15645 A, EP 1191613 A, EP 1191612 A, EP 1191614 A, WO 2005/033244 A and WO 2011/032626 A. In general, all phosphorescent complexes as are used in accordance with the prior art for phosphorescent OLEDs and as are known to the person skilled in the art in the area of organic electroluminescence are suitable, and the person skilled in the art will be able to use further phosphorescent complexes without inventive step.

Phosphorescent metal complexes preferably contain Ir, Ru, Pd, Pt, Os or Re.

Preferred ligands are 2-phenylpyridine derivatives, 7,8-benzoquinoline derivatives, 2-(2-thienyl)pyridine derivatives, 2-(1-naphthyl)pyridine derivatives, 1-phenylisoquinoline derivatives, 3-phenylisoquinoline derivatives or 2-phenylquinoline derivatives. All these compounds may be substituted, for example by fluoro, cyano and/or trifluoromethyl substituents for blue. Aux-iliary ligands are preferably acetylacetonate or picolinic acid.

In particular, complexes of Pt or Pd with tetradentate ligands of the formula EM-16 are suitable formula EM-16

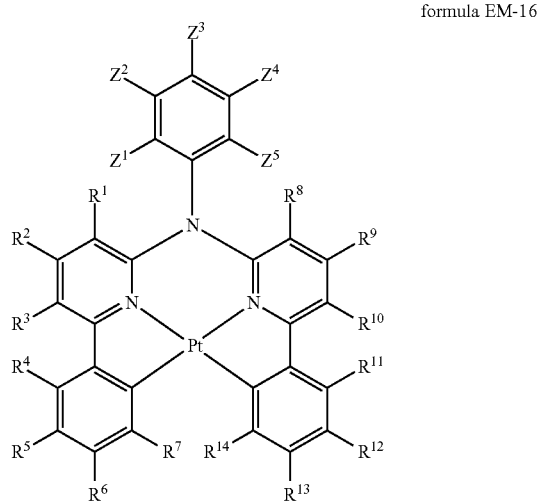

The compounds of the formula EM-16 are described in greater detail in US 2007/0087219 A1, where, for an explanation of the substituents and indices in the above formula, reference is made to this specification for disclosure purposes. Furthermore, Pt-porphyrin complexes having an enlarged ring system (US 2009/0061681 A1) and Ir complexes, for example 2,3,7,8,12,13,17,18-octaethyl-21H, 23H-porphyrin-Pt(II), tetraphenyl-Pt(II) tetrabenzoporphyrin (US 2009/0061681 A1), cis-bis(2-phenylpyridinato-N, $C^{2'}$)Pt(II), cis-bis(2-(2'-thienyl)pyridinato-N,$C^{3'}$)Pt(II), cis-bis(2-(2'-thienyl)-quinolinato-N,$C^{5'}$)Pt(II), (2-(4,6-difluorophenyl)-pyridinato-N,$C^{2'}$)Pt(II) (acetylacetonate), or tris(2-phenylpyridinato-N,$C^{2'}$)Ir(III) (=Ir(ppy)$_3$, green), bis(2-phenylpyridinato-N,$C^2$)Ir(III) (acetylacetonate) (=Ir (ppy)$_2$ acetylacetonate, green, US 2001/0053462 A1, Baldo, Thompson et al. Nature 403, (2000), 750-753), bis(1-phenylisoquinolinato-N,$C^{2'}$)(2-phenyl-pyridinato-N,$C^{2'}$) iridium(III), bis(2-phenylpyridinato-N,$C^{2'}$)(1-phenylisoquino-linato-N,$C^{2'}$)iridium(III), bis(2-(2'-benzothienyl)pyridinato-N,$C^{3'}$)iridium(III) (acetylacetonate), bis(2-(4',6'-difluorophenyl)pyridinato-N,$C^{2'}$)iridium(III) (piccolinate) (FIrpic, blue), bis(2-(4',6'-difluorophenyl)pyridinato-N,$C^{2'}$) Ir(III) (tetrakis(1-pyrazolyl)borate), tris(2-(biphenyl-3-yl)-4-tert-butylpyridine)-iridium(III), (ppz)$_2$Ir(5phdpym) (US 2009/0061681 A1), (45ooppz)$_2$-Ir(5phdpym) (US 2009/0061681 A1), derivatives of 2-phenylpyridine-Ir complexes, such as, for example, PQIr (=iridium(III) bis(2-phenylquinolyl-N,$C^{2'}$)acetylacetonate), tris(2-phenylisoquinolinato-N,C)Ir(III) (red), bis(2-(2'-benzo[4,5-a]thienyl)pyridinato-N,$C^3$)Ir (acetylacetonate) ([Btp$_2$Ir(acac)], red, Adachi et al. Appl. Phys. Lett. 78 (2001), 1622-1624).

Likewise suitable are complexes of trivalent lanthanides, such as, for example, $Tb^{3+}$ and $Eu^{3+}$ (J. Kido et al. Appl. Phys. Lett. 65 (1994), 2124, Kido et al. Chem. Lett. 657, 1990, US 2007/0252517 A1), or phosphorescent complexes of Pt(II), Ir(l), Rh(l) with maleonitrile dithiolate (Johnson et al., JACS 105, 1983, 1795), Re(I) tricarbonyl-diimine complexes (Wrighton, JACS 96, 1974, 998, inter alia), Os(II) complexes with cyano ligands and bipyridyl or phenanthroline ligands (Ma et al., Synth. Metals 94, 1998, 245).

Further phosphorescent emitters having tridentate ligands are described in U.S. Pat. No. 6,824,895 and U.S. Ser. No. 10/729,238. Red-emitting phosphorescent complexes are found in U.S. Pat. Nos. 6,835,469 and 6,830,828.

Preferred compounds which can be used as phosphorescent emitters are, for example, the compounds of the formula EM-17 described, inter alia, in US 2001/0053462 A1 and Inorg. Chem. 2001, 40(7), 1704-1711, JACS 2001, 123(18), 4304-4312, and derivatives thereof.

formula EM-17

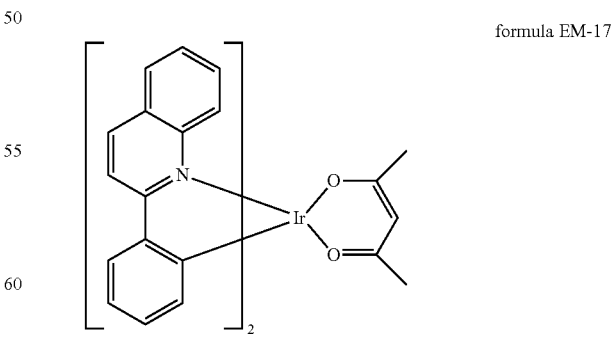

Derivatives are described in U.S. Pat. Nos. 7,378,162 B2, 6,835,469 B2 and JP 2003/253145 A.

Furthermore, the compounds of the formulae EM-18 to EM-21 described in U.S. Pat. No. 7,238,437 B2, US 2009/

008607 A1 and EP 1348711, and derivatives thereof, can be employed as phosphorescent emitters.
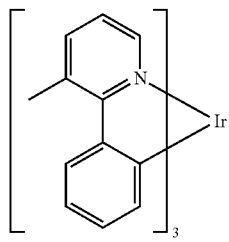
formula EM-18
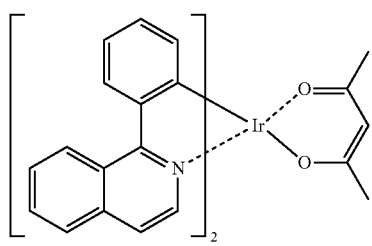
formula EM-19
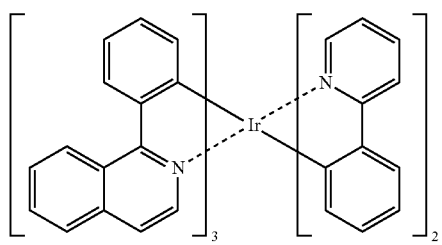
formula EM-20
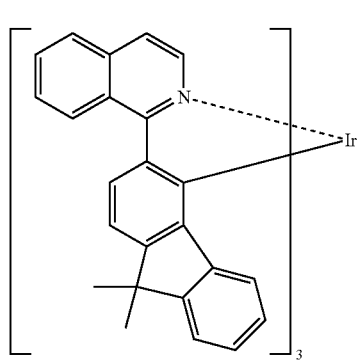
formula EM-21
The compounds described in US 2001/0053462 A1, for examples the compounds of the following formulae EM-22 to EM-71, can be used as phosphorescent emitters preferably.
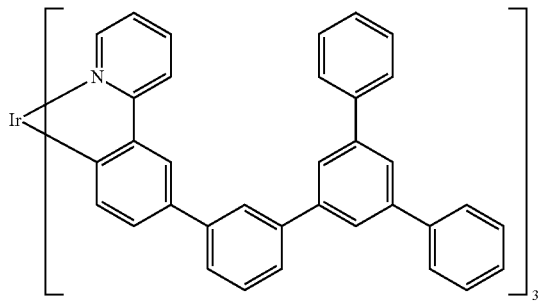
Formula EM-22
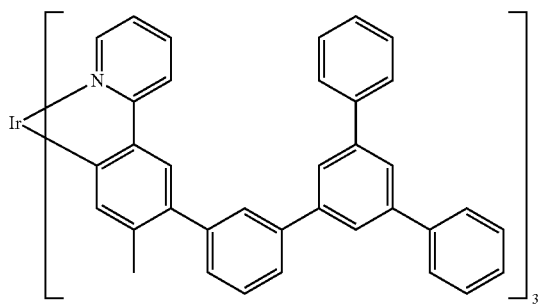
Formula EM-23
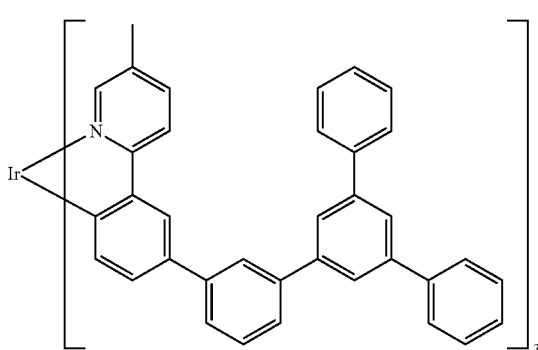
Formula EM-24
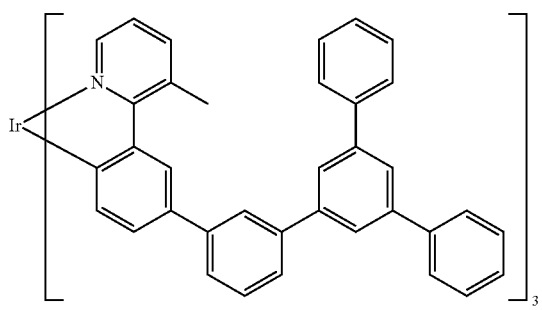
Formula EM-25

Formula EM-26
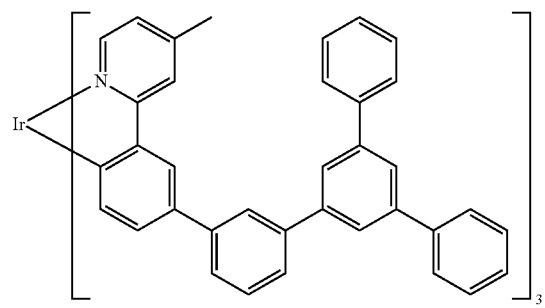
Formula EM-27
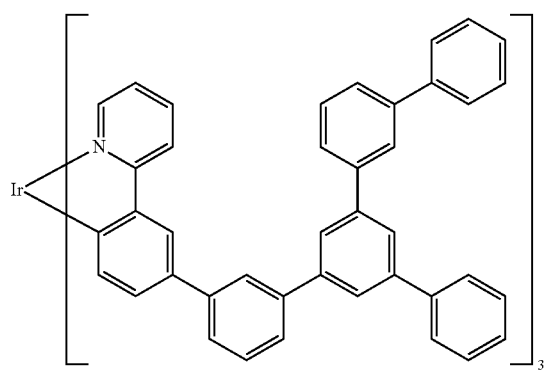
Formula EM-28
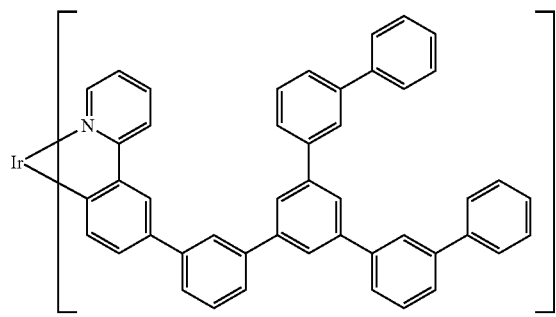
Formula EM-29
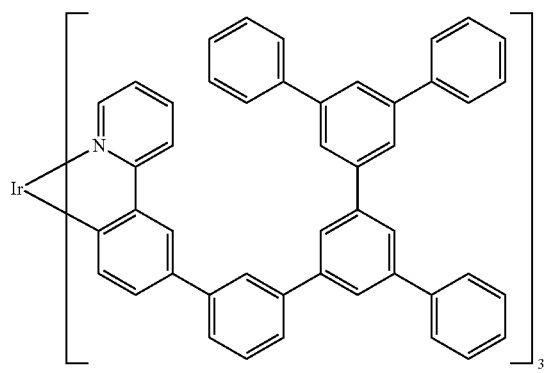
Formula EM-30
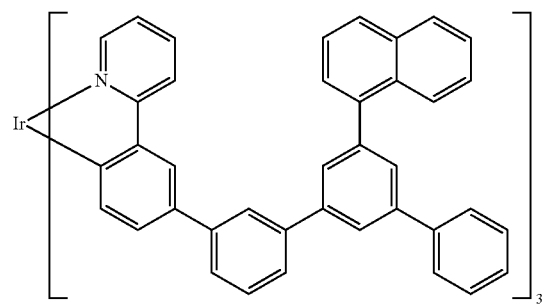
Formula EM-31
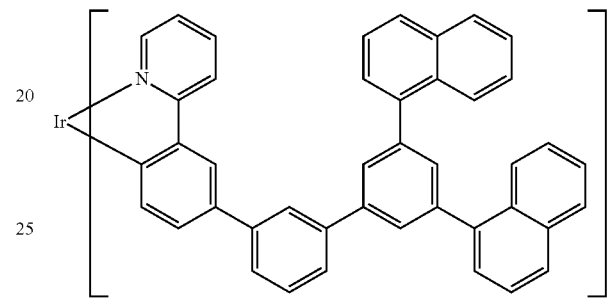
Formula EM-32
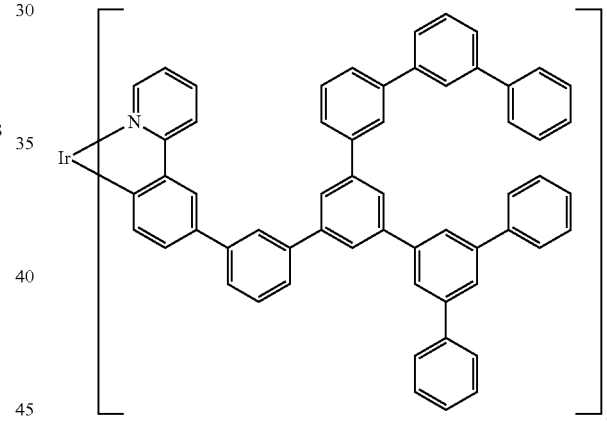
Formula EM-33
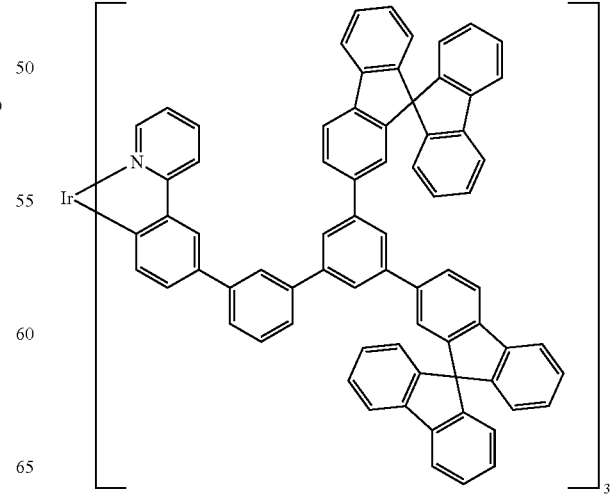

Formula EM-34
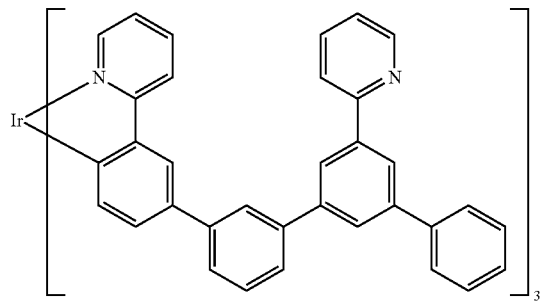
Formula EM-35
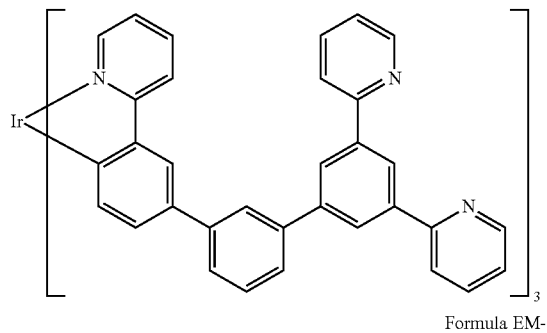
Formula EM-36
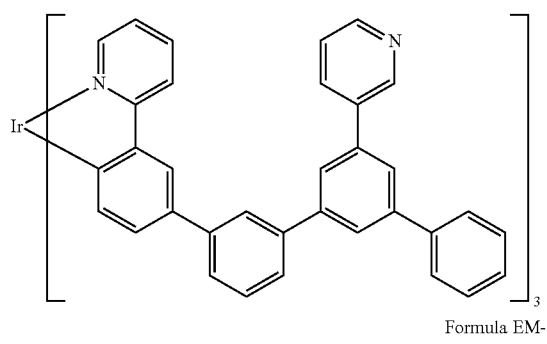
Formula EM-37
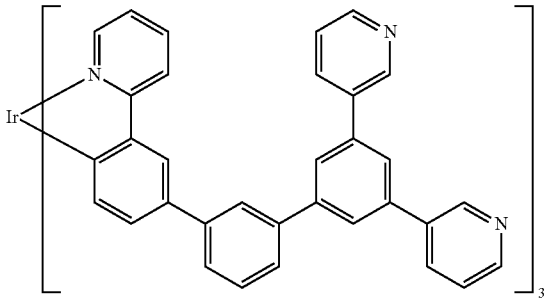
Formula EM-38
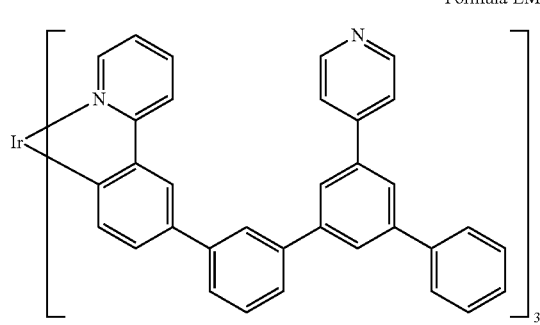
Formula EM-39
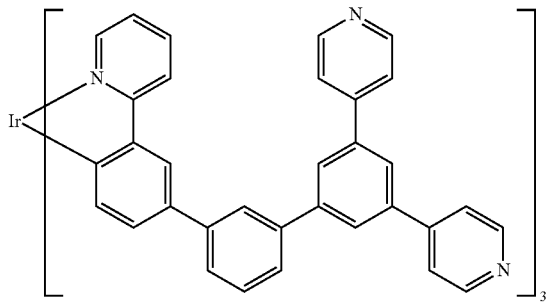
Formula EM-40
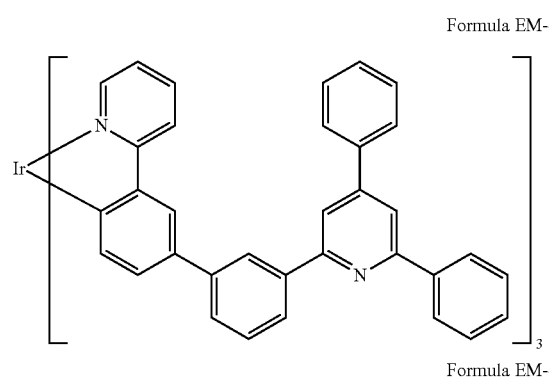
Formula EM-41
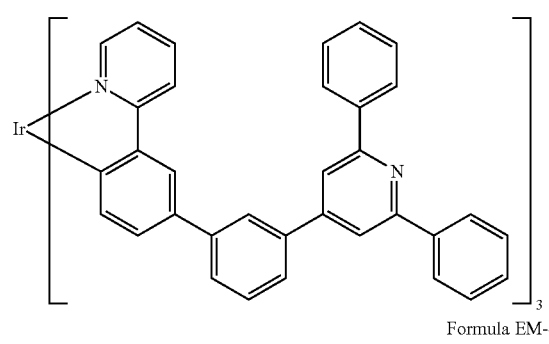
Formula EM-42
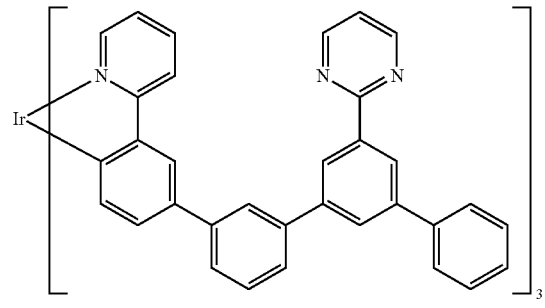
Formula EM-43
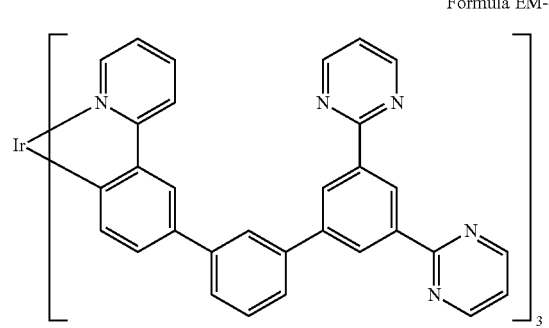

Formula EM-44
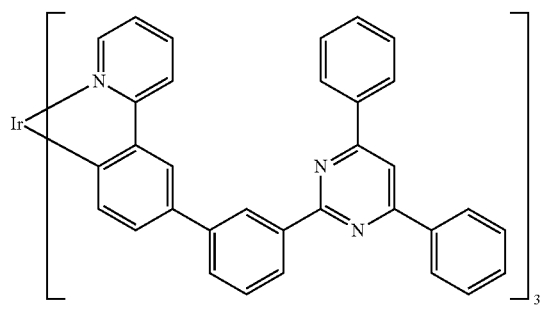
Formula EM-45
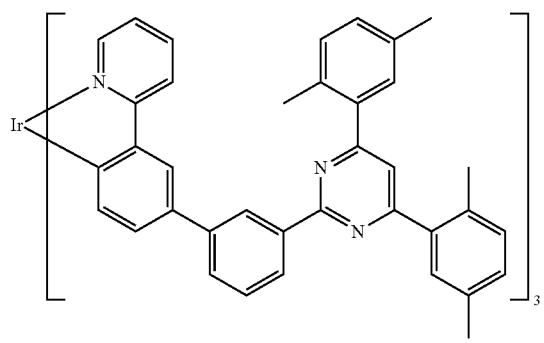
Formula EM-46
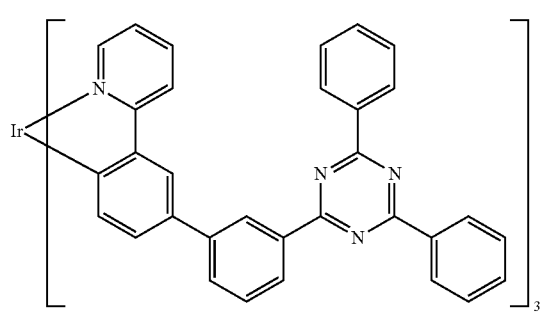
Formula EM-47
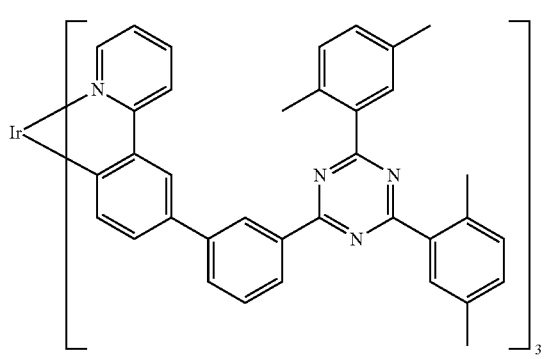
Formula EM-48
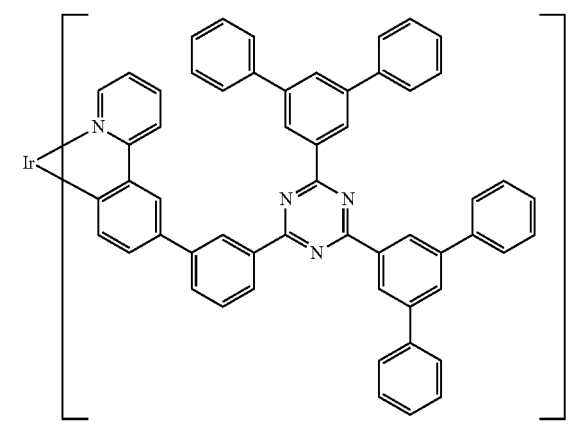
Formula EM-49
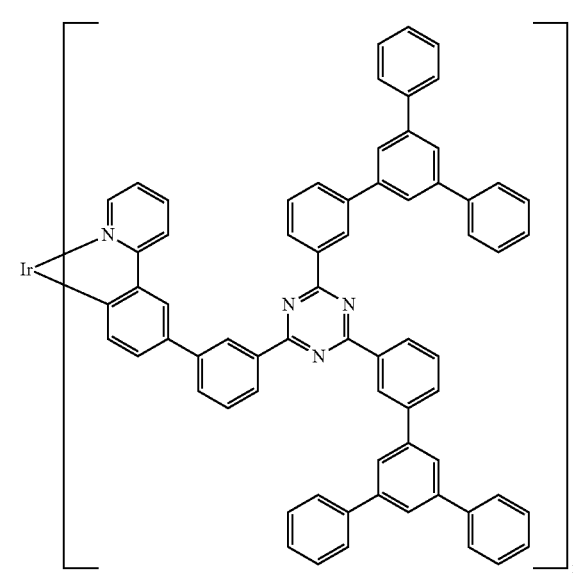
Formula EM-50
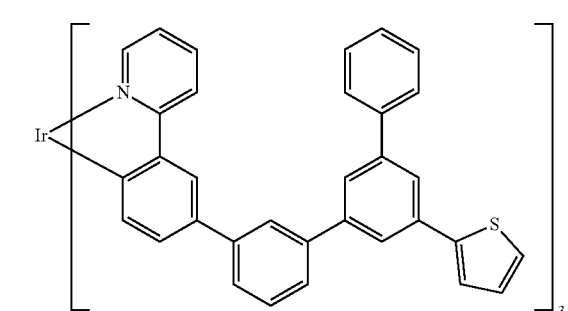

Formula EM-51
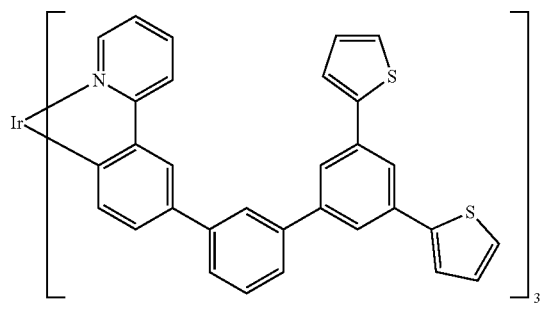
Formula EM-52
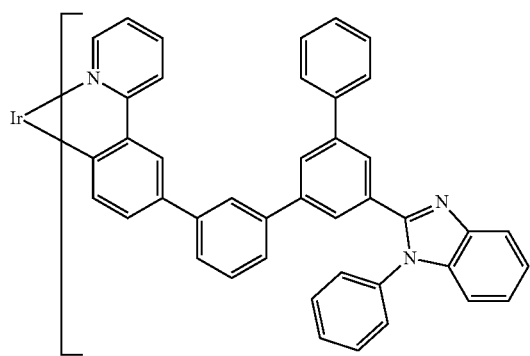
Formula EM-53
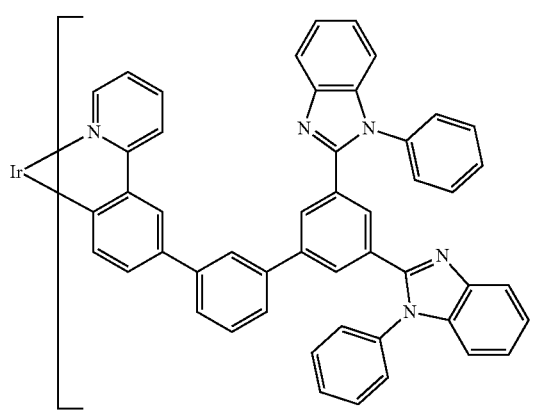
Formula EM-54
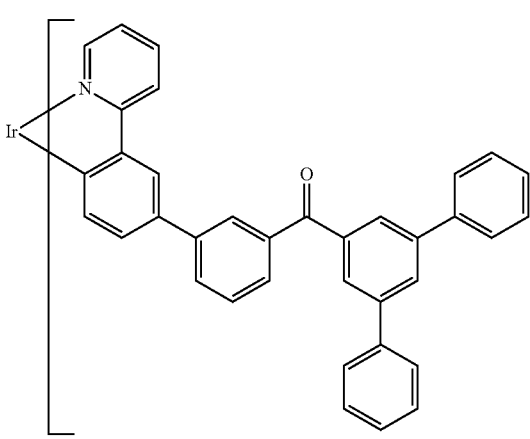
Formula EM-55
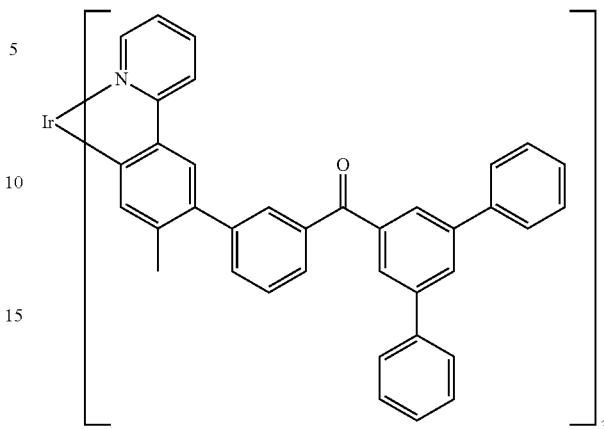
Formula EM-56
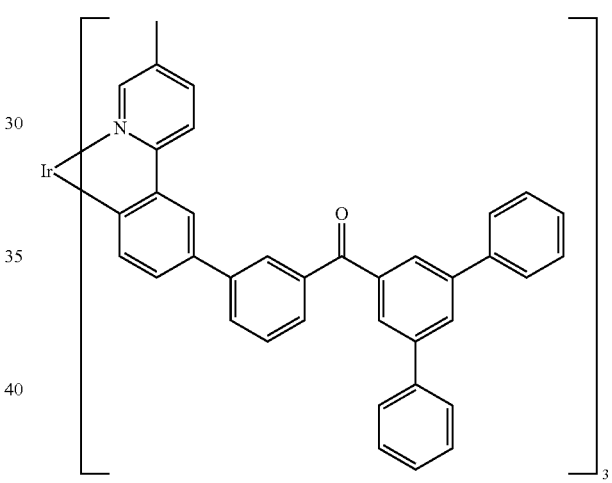
Formula EM-57
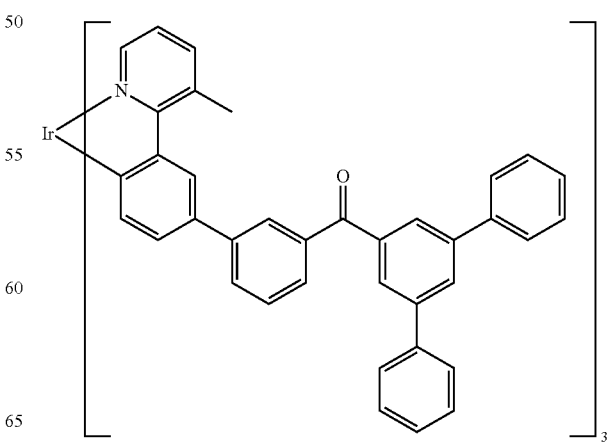

-continued
Formula EM-58
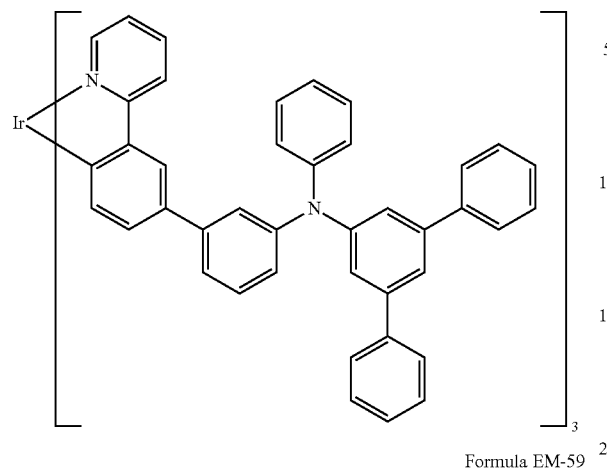
Formula EM-59
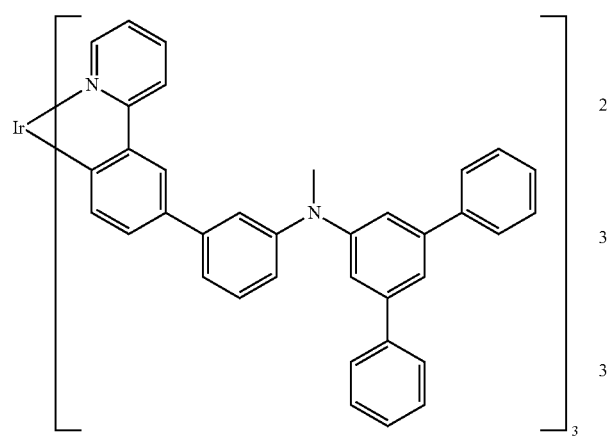
Formula EM-60
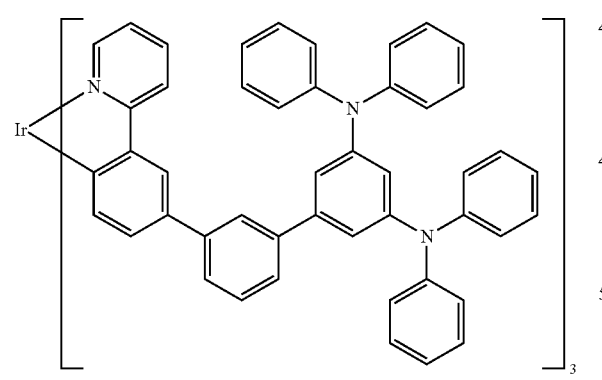
Formula EM-61
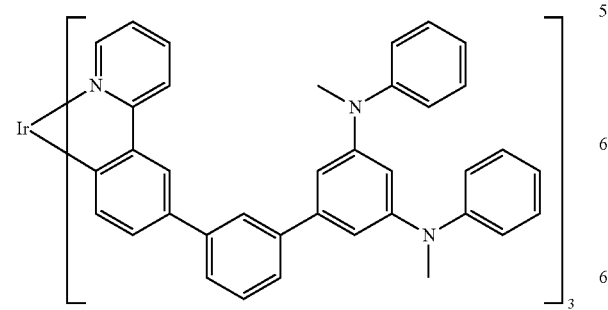
Formula EM-62
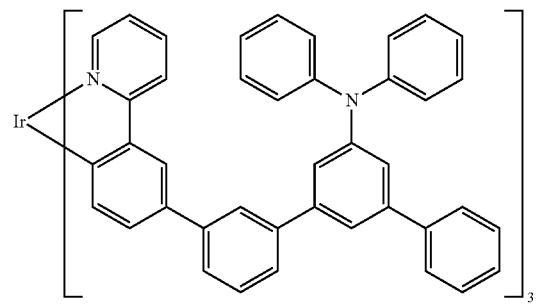
Formula EM-63
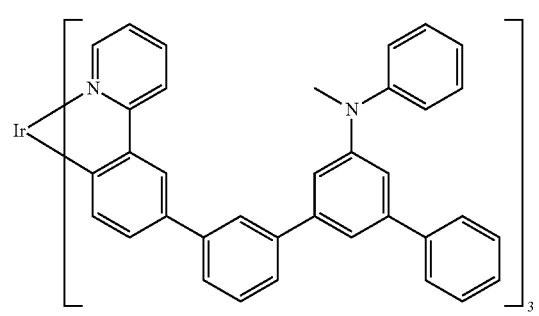
Formula EM-64
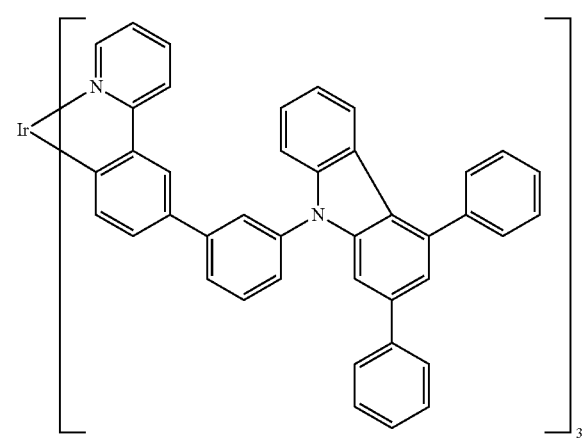
Formula EM-65
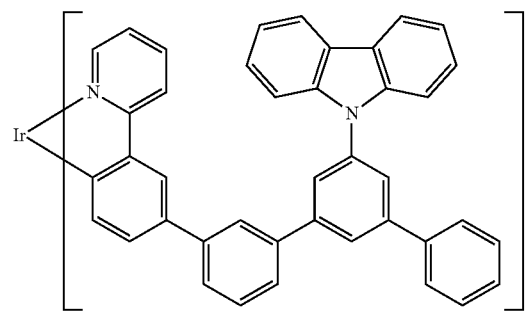

-continued

Formula EM-66

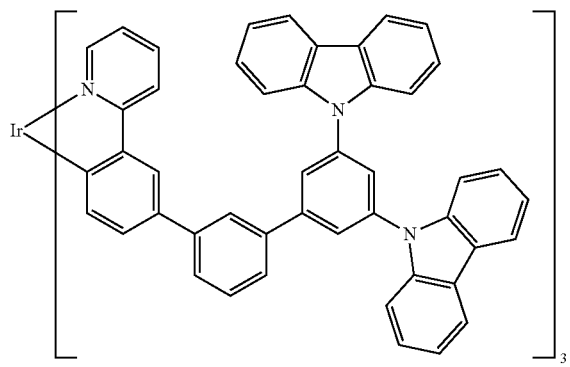

Formula EM-67

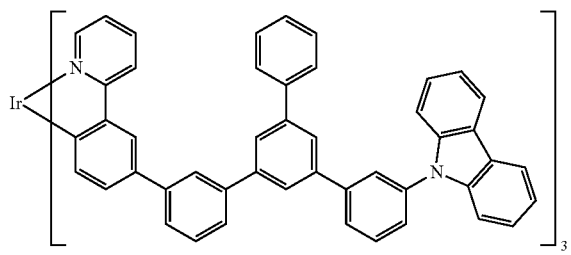

Formula EM-68

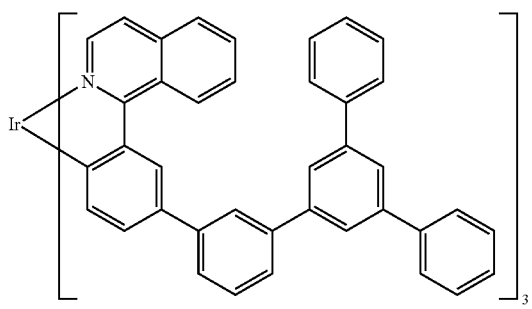

Formula EM-69

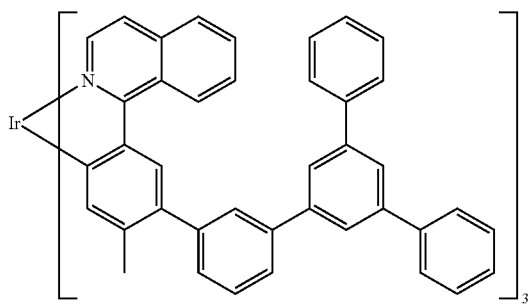

-continued

Formula EM-70

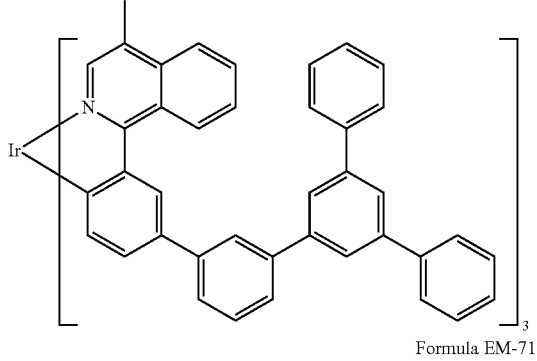

Formula EM-71

Quantum dots can likewise be employed as emitters, these materials being disclosed in detail in WO 2011/076314 A1.

Compounds which are employed as host materials, in particular together with emitting compounds, include materials from various classes of substance.

Host materials generally have larger band gaps between HOMO and LUMO than the emitter materials employed. In addition, preferred host materials exhibit properties of either a hole- or electron-transport material. Furthermore, host materials can have both electron- and hole-transport properties.

Host materials are in some cases also called matrix material, in particular if the host material is employed in combination with a phosphorescent emitter in an OLED.

Preferred host materials or co-host materials, which are employed, in particular, together with fluorescent dopants, are selected from the classes of the oligoarylenes (for example 2,2',7,7'-tetraphenylspirobifluorene in accordance with EP 676461 or dinaphthylanthracene), in particular the oligoarylenes containing condensed aromatic groups, such as, for example, anthracene, benzanthracene, benzophenanthrene (DE 10 2009 005746, WO 2009/069566), phenanthrene, tetracene, coronene, chrysene, fluorene, spirofluorene, perylene, phthaloperylene, naphthaloperylene, decacyclene, rubrene, the oligoarylenevinylenes (for example DPVBi=4,4'-bis(2,2-diphenylethenyl)-1,1'-biphenyl or spiro-DPVBi in accordance with EP 676461), the polypodal metal complexes (for example in accordance with WO 04/081017), in particular metal complexes of 8-hydroxyquinoline, for example AlQ$_3$ (=aluminium(III) tris(8-hydroxyquinoline)) or bis(2-methyl-8-quinolinolato)-4-(phenylphenolino-lato)aluminium, also with imidazole chelate (US 2007/0092753 A1) and the quinoline-metal complexes, amino-quinoline-metal complexes, benzoquinoline-metal complexes, the hole-conducting compounds (for example in accordance with WO 2004/058911), the electron-conducting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052) or the benzanthracenes (for example in accordance with WO 2008/145239).

Particularly preferred compounds which can serve as host materials or co-host materials are selected from the classes of the oligoarylenes, comprising anthracene, benzanthracene and/or pyrene, or atropisomers of these compounds. An oligoarylene in the sense of the present invention is intended to be taken to mean a compound in which at least three aryl or arylene groups are bonded to one another.

Preferred host materials are selected, in particular, from compounds of the formula (H-1),

(H-1)

where $Ar^4$, $Ar^5$, $Ar^6$ are on each occurrence, identically or differently, an aryl or heteroaryl group having 5 to 30 aromatic ring atoms, which may optionally be substituted, and p represents an integer in the range from 1 to 5; the sum of the π electrons in $Ar^4$, $Ar^5$ and $Ar^6$ is at least 30 if p=1 and at least 36 if p=2 and at least 42 if p=3.

In the compounds of the formula (H-1), the group $Ar^5$ particularly preferably stands for anthracene, and the groups $Ar^4$ and $Ar^6$ are bonded in the 9- and 10-position, where these groups may optionally be substituted. Very particularly preferably, at least one of the groups $Ar^4$ and/or $Ar^6$ is a condensed aryl group selected from 1- or 2-naphthyl, 2-, 3- or 9-phenanthrenyl or 2-, 3-, 4-, 5-, 6- or 7-benzanthracenyl. Anthracene-based compounds are described in US 2007/0092753 A1 and US 2007/0252517 A1, for example 2-(4-methylphenyl)-9,10-di-(2-naphthyl)anthracene, 9-(2-naphthyl)-10-(1,1'-biphenyl)anthracene and 9,10-bis[4-(2,2-diphenylethenyl)phenyl]anthracene, 9,10-diphenylanthracene, 9,10-bis(phenylethynyl)anthracene and 1,4-bis(9'-ethynylanthracenyl)benzene. Preference is also given to compounds containing two anthracene units (US 2008/0193796 A1), for example 10,10'-bis[1,1',4',1"]terphenyl-2-yl-9,9'-bisanthracenyl.

Further preferred compounds are derivatives of arylamine, styrylamine, fluorescein, diphenylbutadiene, tetraphenylbutadiene, cyclopentadiene, tetraphenylcyclopentadiene, pentaphenylcyclopentadiene, coumarine, oxadiazole, bisbenzoxazoline, oxazole, pyridine, pyrazine, imine, benzothiazole, benzoxazole, benzimidazole (US 2007/0092753 A1), for example 2,2',2"-(1,3,5-phenylene)tris[1-phenyl-1H-benzimidazole], aldazine, stilbene, styrylarylene derivatives, for example 9,10-bis[4-(2,2-diphenyl-ethenyl)phenyl]anthracene, and distyrylarylene derivatives (U.S. Pat. No. 5,121,029), diphenylethylene, vinylanthracene, diaminocarbazole, pyran, thiopyran, diketopyrrolopyrrole, polymethine, cinnamic acid esters and fluorescent dyes.

Particular preference is given to derivatives of arylamine and styrylamine, for example TNB (=4,4'-bis[N-(1-naphthyl)-N-(2-naphthyl)amino]biphenyl). Metal-oxinoid complexes, such as LiQ or $AlQ_3$, can be used as co-hosts.

Preferred compounds with oligoarylene as matrix are disclosed in US 2003/0027016 A1, U.S. Pat. No. 7,326,371 B2, US 2006/043858 A, WO 2007/114358, WO 2008/145239, JP 3148176 B2, EP 1009044, US 2004/018383, WO 2005/061656 A1, EP 0681019B1, US 2004/013073A1, U.S. Pat. No. 5,077,142, WO 2007/065678 and DE 102009005746, where particularly preferred compounds are described by the formulae H-2 to H-8.

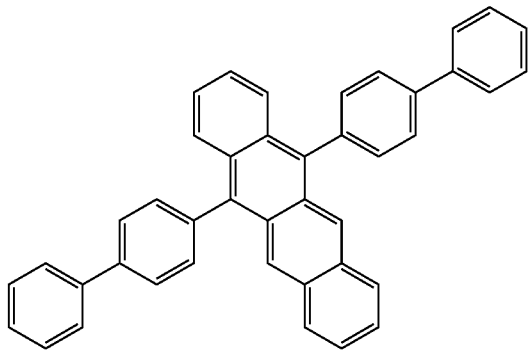

formula H-2

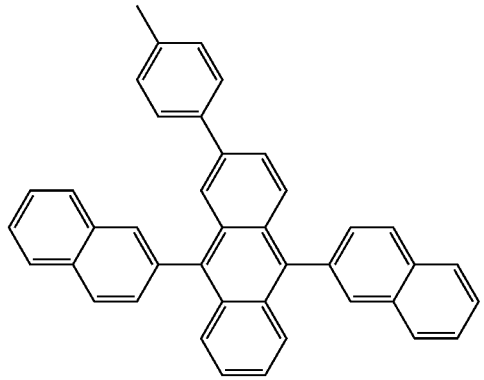

formula H-3

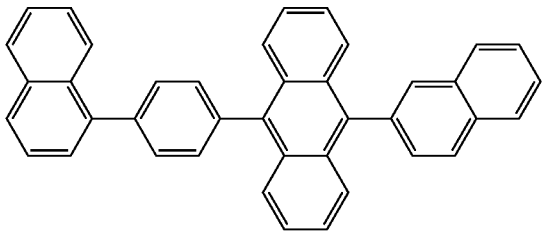

formula H-4

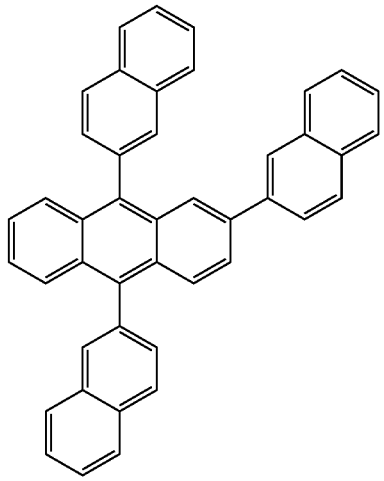

formula H-5 formula H-6

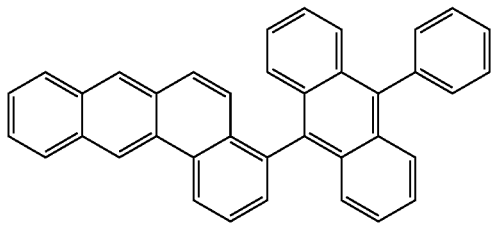

formula H-7

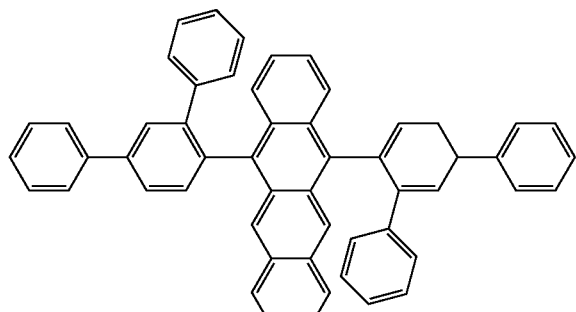

formula H-8

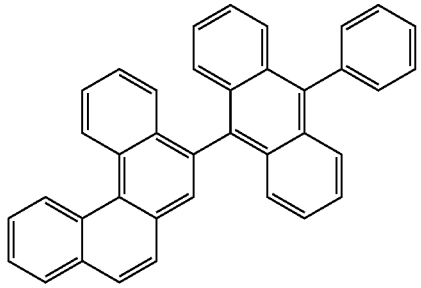

Furthermore, compounds which can be employed as host or matrix include materials which are employed together with phosphorescent emitters.

These compounds, include CBP (N,N-biscarbazolylbiphenyl), carbazole derivatives (for example in accordance with WO 2005/039246, US 2005/0069729, JP 2004/288381, EP 1205527 or WO 2008/086851), azacarbazoles (for example in accordance with EP 1617710, EP 1617711, EP 1731584 or JP 2005/347160), ketones (for example in accordance with WO 2004/093207 or in accordance with DE 102008033943), phosphine oxides, sulfoxides and sulfones (for example in accordance with WO 2005/003253), oligophenylenes, aromatic amines (for example in accordance with US 2005/0069729), bipolar matrix materials (for example in accordance with WO 2007/137725), silanes (for example in accordance with WO 2005/111172), 9,9-diarylfluorene derivatives (for example in accordance with DE 102008017591), azaboroles or boronic esters (for example in accordance with WO 2006/117052), triazine derivatives (for example in accordance with DE 102008036982), indolocarbazole derivatives (for example in accordance with WO 2007/063754 or WO 2008/056746), indenocarbazole derivatives (for example in accordance with DE 102009023155 and DE 102009031021), diazaphosphole derivatives (for example in accordance with DE 102009022858), triazole derivatives, oxazoles and oxazole derivatives, imidazole derivatives, polyarylalkane derivatives, pyrazoline derivatives, pyrazolone derivatives, distyrylpyrazine derivatives, thiopyran dioxide derivatives, phenylenediamine derivatives, tertiary aromatic amines, styrylamines, amino-substituted chalcone derivatives, indoles, hydrazone derivatives, stilbene derivatives, silazane derivatives, aromatic dimethylidene compounds, carbodiimide derivatives, metal complexes of 8-hydroxyquinoline derivatives, such as, for example, AlQ$_3$, which may also contain triarylaminophenol ligands (US 2007/0134514 A1), metal complex compounds, and thiophene, benzothiophene and dibenzothiophene derivatives.

Examples of preferred carbazole derivatives are mCP (=1,3-N,N-di-carbazolylbenzene (=9,9'-(1,3-phenylene)bis-9H-carbazole)) (formula H-9), CDBP (=9,9'-(2,2'-dimethyl[1,1'-biphenyl]-4,4'-diyl)bis-9H-carbazole), 1,3-bis(N,N'-dicarbazolyl)benzene (=1,3-bis(carbazol-9-yl)benzene), 3,5-di(9H-carbazol-9-yl)biphenyl and CMTTP (formula H-10). Particularly referred compounds are disclosed in US 2007/0128467 A1 and US 2005/0249976 A1 (formulae H-11 and H-13).

formula H-9

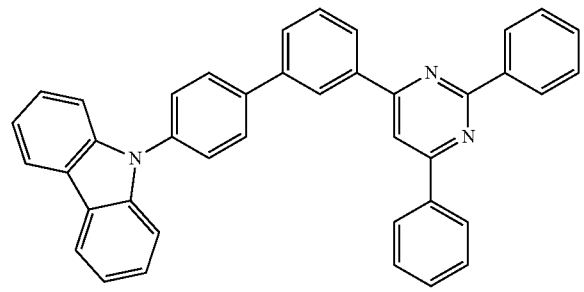

formula H-10

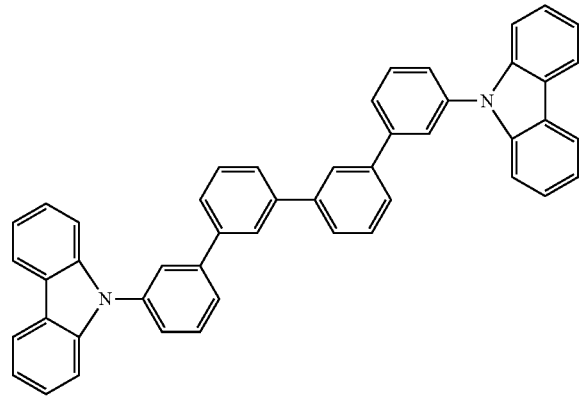

CMTTP formula H-11

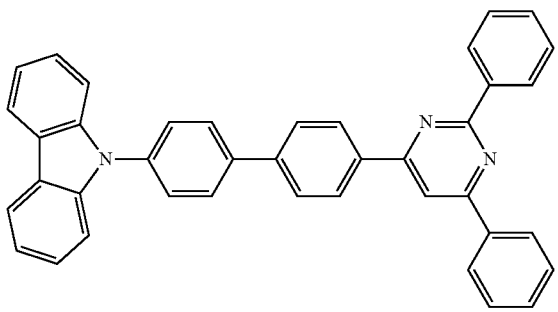

formula H-12

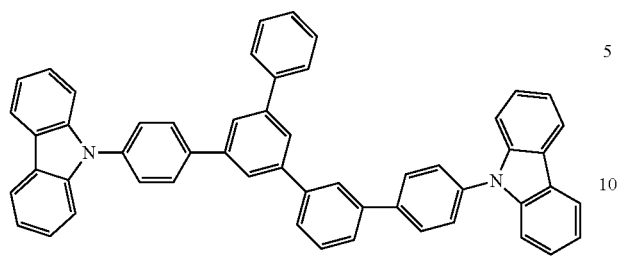

formula H-16

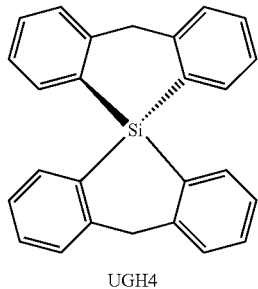

UGH4 formula H-13

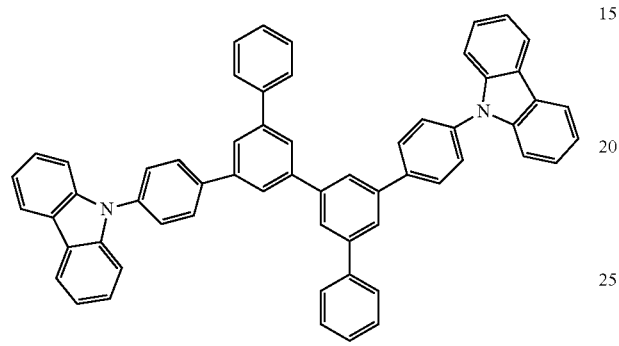

Preferred tetraaryl-Si compounds are disclosed, for example, in US 2004/0209115, US 2004/0209116, US 2007/0087219 A1 and in H. Gilman, E. A. Zuech, Chemistry & Industry (London, United Kingdom), 1960, 120.

Particularly preferred tetraaryl-Si compounds are described by the formulae H-14 to H-21.

formula H-17

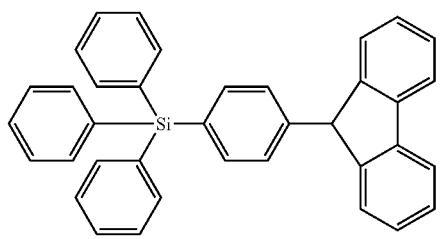

TPSi-F
Triphenyl-[4-(9-phenyl-9H-fluoren-9-yl)phenyl]silane formula H-18

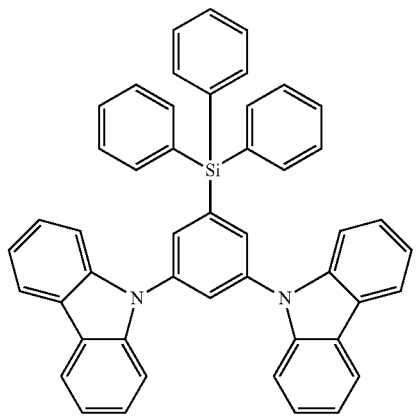

SimCP formula H-14

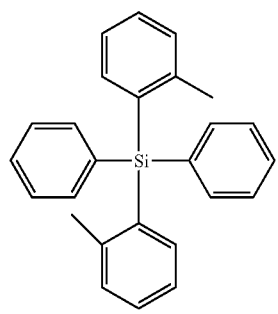

UGH1 formula H-15

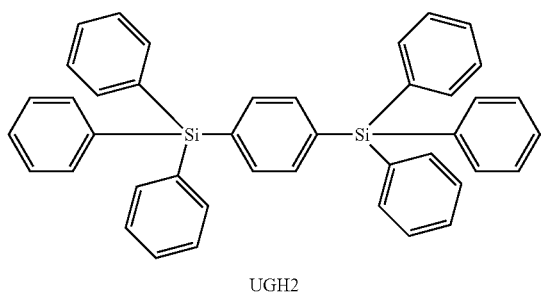

UGH2 formula H-19

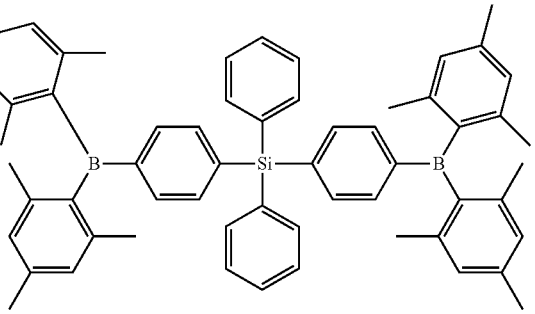

formula H-20
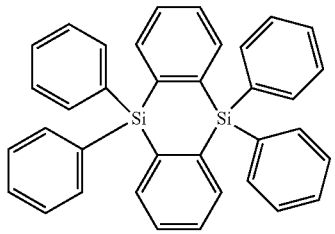
formula H-24
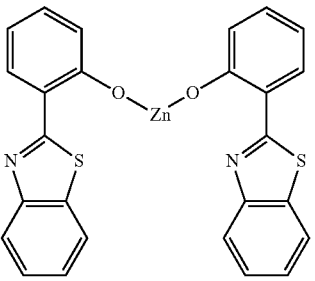
formula H-21
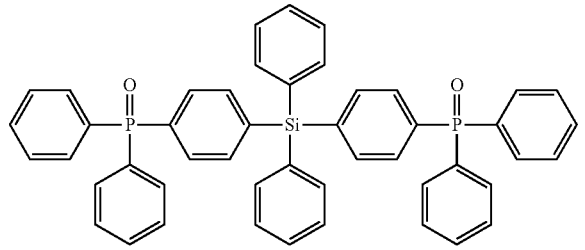
formula H-25
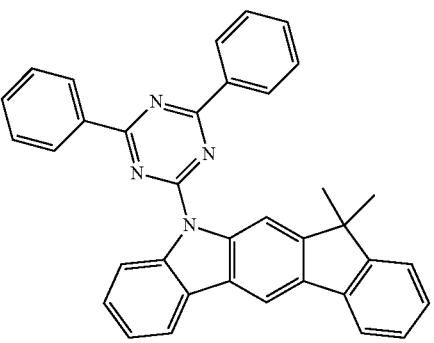
Particularly preferred host material compounds are disclosed, inter alia, in DE 102009022858, DE 102009023155, EP 652273 B1, WO 2007/063754 and WO 2008/056746, and WO 2005/053055, where particularly preferred compounds are described by the formulae H-22 to H-39.
formula H-22
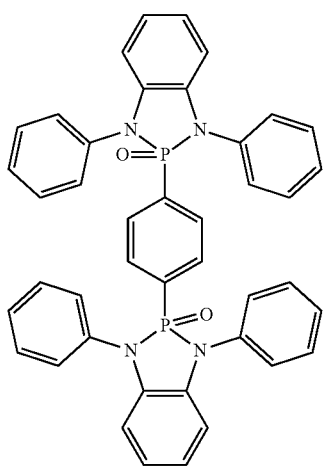
formula H-26
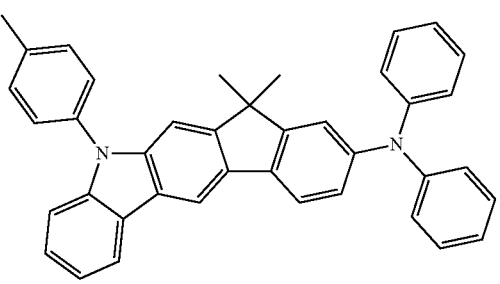
formula H-23
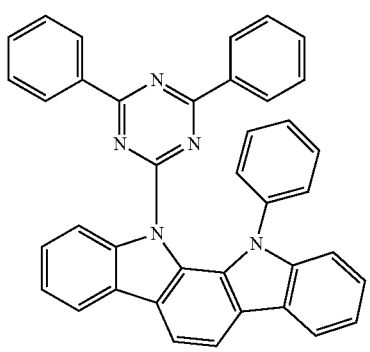
formula H-27
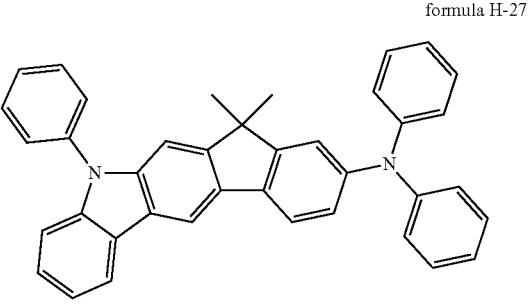

formula H-28
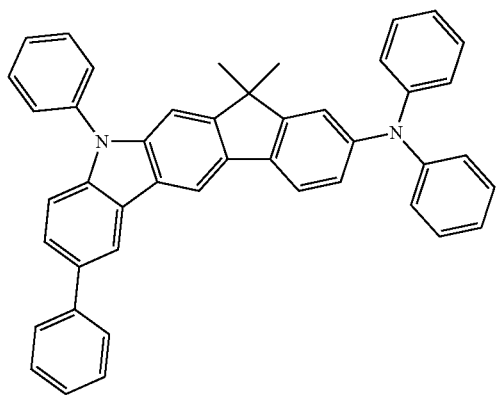
formula H-31
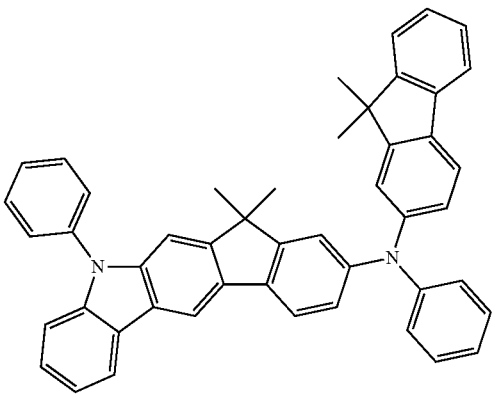
formula H-29
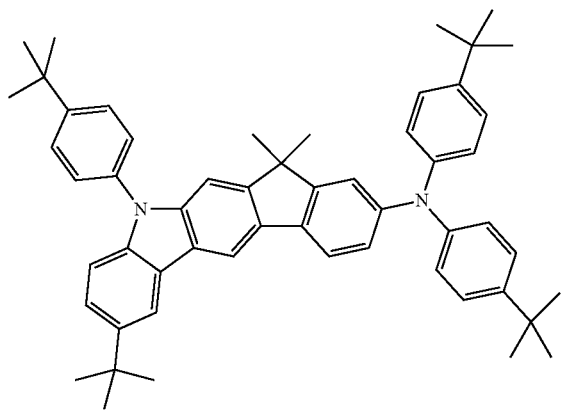
formula H-32
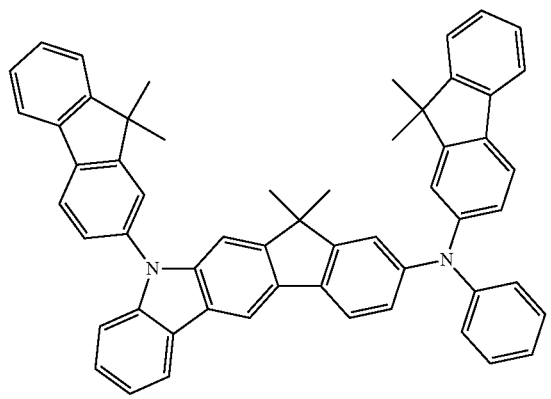
formula H-30
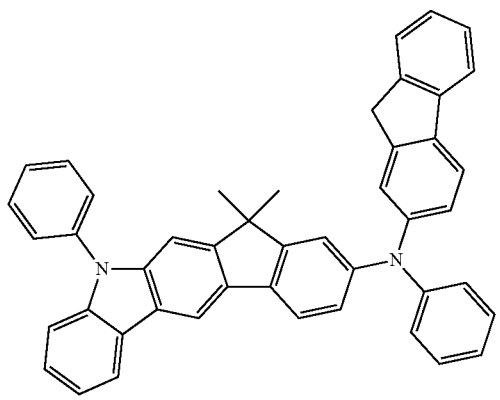
formula H-33
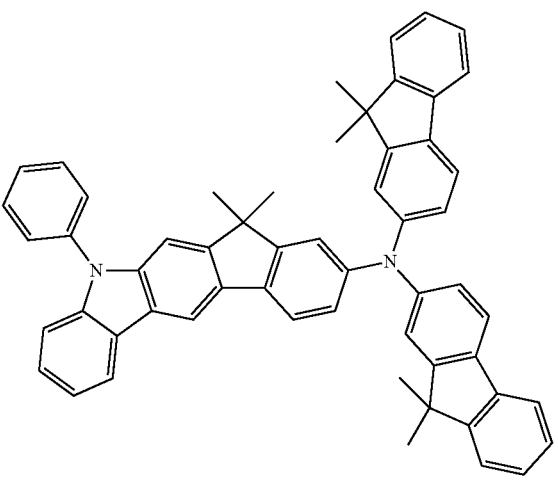

formula H-34
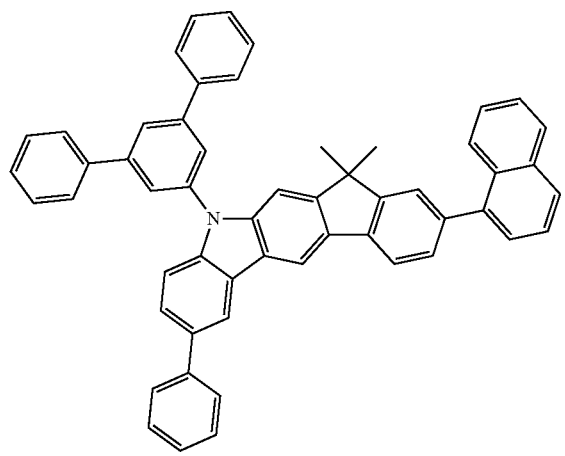
formula H-35
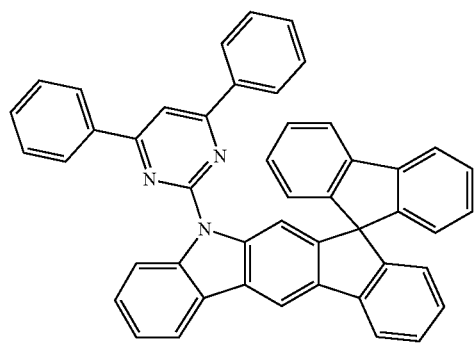
formula H-36
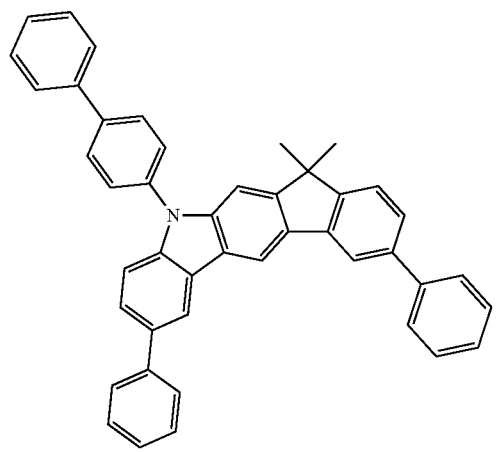
formula H-37
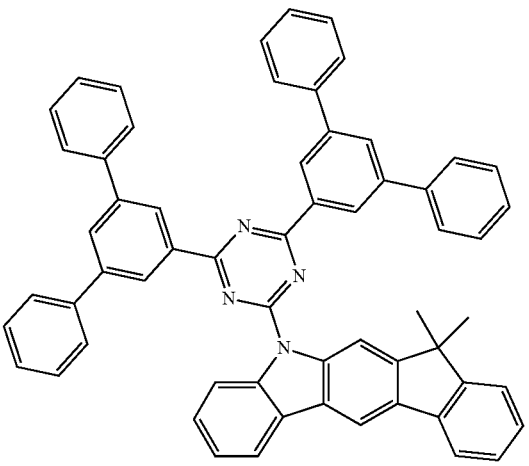
formula H-38
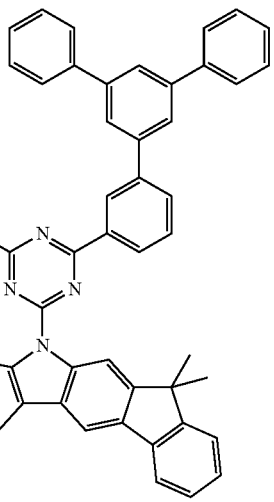
formula H-39
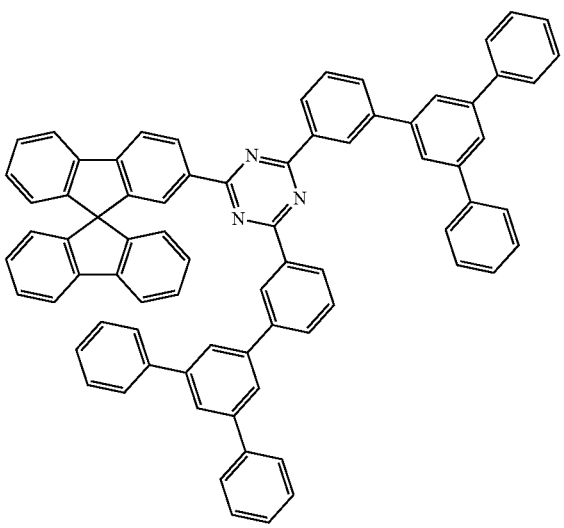
With respect to the functional compounds which can be employed in accordance with the invention and which can serve as host material, espe-cial preference is given to substances which contain at least one nitrogen atom. These preferably include aromatic amines, triazine derivatives and carbazole derivatives. Thus, carbazole derivatives in particular exhibit surprisingly high efficiency. Triazine derivatives result in unexpectedly long lifetimes of the electronic devices.

It may also be preferred to employ a plurality of different matrix materials as a mixture, in particular at least one electron-conducting matrix material and at least one hole-conducting matrix material. Preference is likewise given to the use of a mixture of a charge-transporting matrix material and an electrically inert matrix material which is not in involved in the charge transport to a significant extent, if at all, as described, for example, in WO 2010/108579.

It is furthermore possible to employ compounds which improve the transition from the singlet state to the triplet state and which, employed in support of the functional compounds having emitter properties, improve the phosphorescence properties of these compounds. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

N-Dopants herein are taken to mean reducing agents, i.e. electron donors. Preferred examples of n-dopants are $W(hpp)_4$ and other electron-rich metal complexes in accordance with WO 2005/086251 A2, P=N compounds (for example WO 2012/175535 A1, WO 2012/175219 A1), naphthylenecarbo-diimides (for example WO 2012/168358 A1), fluorenes (for example WO 2012/031735 A1), free radicals and diradicals (for example EP 1837926 A1, WO 2007/107306 A1), pyridines (for example EP 2452946 A1, EP 2463927 A1), N-heterocyclic compounds (for example WO 2009/000237 A1) and acridines as well as phenazines (for example US 2007/145355 A1).

Furthermore, the ink compositions may comprise a wide-band-gap material as functional material. Wide-band-gap material is taken to mean a material in the sense of the disclosure content of U.S. Pat. No. 7,294,849. These systems exhibit particularly advantageous performance data in electroluminescent devices.

The compound employed as wide-band-gap material can preferably have a band gap of 2.5 eV or more, preferably 3.0 eV or more, particularly preferably 3.5 eV or more. The band gap can be calculated, inter alia, by means of the energy levels of the highest occupied molecular orbital (HOMO) and the lowest unoccupied molecular orbital (LUMO).

Furthermore, the ink compositions may comprise a hole-blocking material (HBM) as functional material. A hole-blocking material denotes a material which prevents or minimises the transmission of holes (positive charges) in a multilayer system, in particular if this material is arranged in the form of a layer adjacent to an emission layer or a hole-conducting layer. In general, a hole-blocking material has a lower HOMO level than the hole-transport material in the adjacent layer. Hole-blocking layers are frequently arranged between the light-emitting layer and the electron-transport layer in OLEDs.

It is basically possible to employ any known hole-blocking material. In addition to other hole-blocking materials described elsewhere in the present application, advantageous hole-blocking materials are metal complexes (US 2003/0068528), such as, for example, bis(2-methyl-8-quinolinolato)(4-phenylphenolato)aluminium(III) (BAlQ). Fac-tris(1-phenylpyrazolato-N,C2)-iridium(III) ($Ir(ppz)_3$) is likewise employed for this purpose (US 2003/0175553 A1). Phenanthroline derivatives, such as, for example, BCP, or phthalimides, such as, for example, TMPP, can likewise be employed.

Furthermore, advantageous hole-blocking materials are described in WO 00/70655 A2, WO 01/41512 and WO 01/93642 A1.

Furthermore, the ink compositions may comprise an electron-blocking material (EBM) as functional material. An electron-blocking material denotes a material which prevents or minimises the transmission of electrons in a multilayer system, in particular if this material is arranged in the form of a layer adjacent to an emission layer or an electron-conducting layer. In general, an electron-blocking material has a higher LUMO level than the electron-transport material in the adjacent layer.

It is basically possible to employ any known electron-blocking material. In addition to other electron-blocking materials described elsewhere in the present application, advantageous electron-blocking materials are transition-metal complexes, such as, for example, $Ir(ppz)_3$ (US 2003/0175553).

The electron-blocking material can preferably be selected from amines, triarylamines and derivatives thereof.

Of particular interest are furthermore functional compounds which are dis-tinguished by a high glass-transition temperature. In this connection, particularly preferred functional compounds which can be employed as organic functional material in the ink compositions are those which have a glass-transition temperature of ≥70° C., preferably ≥100° C., more preferably ≥125° C. and most preferably ≥150° C., determined in accordance with DIN 51005.

In another aspect, the invention relates to the use of the ink composition in an electronic device fabrication process.

According to the present invention, the term "electronic device" is taken to mean an electronic device which comprises anode, cathode and at least one functional layer in between, where this functional layer comprises at least one organic or organometallic compound.

The organic electronic device is preferably an organic electroluminescent device (OLED), an organic integrated circuit (O-IC), an organic field-effect transistor (O-FET), an organic thin-film transistor (O-TFT), an organic, light-emitting transistor (O-LET), an organic solar cell (O-SC), an organic, optical detector, an organic photoreceptor, an organic field-quench device (O-FQD), an organic electrical sensor, a light-emitting electrochemical cell (LEC) or an organic laser diode (O-laser), more preferably an organic electroluminescent device (OLED).

Fabrication/Preparation Methods

In another aspect, the present invention furthermore relates to a method for fabricating an electronic device, wherein the method comprises step (x) and step (y) in this sequence:

(x) printing the ink composition according to any one or more of claims 1 to 13, onto a surface of one layer of the electronic device; and (y) drying the solvent.

Printing Step

According to the present invention, to provide the ink composition onto a substrate to fabricate an optical device, any type of publically known printing method can be used preferably. For examples, ink jet printing, nozzle printing, screen printing, relief printing, immersion coating, gravure coating, roll coating, bar coating, brush coating, spray coating, doctor coating, flow coating, spin coating, and slit coating.

In another aspect, the invention further more relates to an electronic device containing one functional layer comprising the organic functional material fabricated by the method comprises step (x) and step (y) in this sequence:

(x) printing the ink composition according to any one or more of claims 1 to 13, onto a surface of one layer of the electronic device; and (y) drying the solvent.

After the application of the ink composition according to the invention to a substrate or a functional layer already applied, a drying step can be carried out in order to remove the solvent from the continuous phase described above. The drying can preferably be carried out at relatively low temperature and over a relatively long period in order to avoid bubble formation and to obtain a uniform coating. The drying can preferably be carried out at a temperature in the range from 80 to 300° C., more preferably 150 to 250° C. and most preferably 160 to 200° C. The drying here can preferably be carried out at a pressure in the range from $10^{-6}$ mbar to 2 bar, more preferably in the range from $10^{-2}$ mbar to 1 bar and most preferably in the range from $10^{-1}$ mbar to 100 mbar. The duration of the drying depends on the degree of drying to be achieved, where small amounts of water can optionally be removed at relatively high temperature and in combination with sintering, which is preferably to be carried out.

It may furthermore be provided that the process step is repeated a number of times, with formation of different or identical functional layers.

Crosslinking of the functional layer formed can take place here in order to prevent dissolution thereof, as is disclosed, for example, in EP 0 637 899 A1.

The organic electronic device is preferably an organic electroluminescent device (OLED), an organic integrated circuit (O-IC), an organic field-effect transistor (O-FET), an organic thin-film transistor (O-TFT), an organic, light-emitting transistor (O-LET), an organic solar cell (O-SC), an organic, optical detector, an organic photoreceptor, an organic field-quench device (O-FQD), an organic electrical sensor, a light-emitting electrochemical cell (LEC) or an organic laser diode (O-laser), more preferably an organic electroluminescent device (OLED).

Active components are generally the organic or inorganic materials which are introduced between the anode and the cathode, where these active components effect, maintain and/or improve the properties of the electronic device, for example its performance and/or its lifetime, for example charge-injection, charge-transport or charge-blocking materials, but in particular emission materials and matrix materials. The organic functional material which can be employed for the production of functional layers of electronic devices accordingly preferably comprises an active component of the electronic device.

Organic electroluminescent devices are a preferred embodiment of the present invention. The organic electroluminescent device comprises a cathode, an anode and at least one emitting layer.

It is furthermore preferred to employ a mixture of two or more triplet emitters together with a matrix. The triplet emitter having the shorter-wave emission spectrum serves as co-matrix here for the triplet emitter having the longer-wave emission spectrum.

The proportion of the matrix material in the emitting layer in this case is preferably between 50 and 99.9% by vol., more preferably between 80 and 99.5% by vol. and most preferably between 92 and 99.5% by vol. for fluorescent emitting layers and between 85 and 97% by vol. for phosphorescent emitting layers.

Correspondingly, the proportion of the dopant is preferably between 0.1 and 50% by vol., more preferably between 0.5 and 20% by vol. and most preferably between 0.5 and 8% by vol. for fluorescent emitting layers and between 3 and 15% by vol. for phosphorescent emitting layers.

An emitting layer of an organic electroluminescent device may also encom-pass systems which comprise a plurality of matrix materials (mixed-matrix systems) and/or a plurality of dopants. In this case too, the dopants are generally the materials whose proportion in the system is the smaller and the matrix materials are the materials whose proportion in the system is the greater. In individual cases, however, the proportion of an individual matrix material in the system may be smaller than the proportion of an individual dopant.

The mixed-matrix systems preferably comprise two or three different matrix materials, more preferably two different matrix materials. One of the two materials here is preferably a material having hole-transporting properties and the other material is a material having electron-transporting properties.

However, the desired electron-transporting and hole-transporting properties of the mixed-matrix components may also be combined principally or completely in a single mixed-matrix component, where the further mixed-matrix component(s) fulfil(s) other functions. The two different matrix materials may be present here in a ratio of 1:50 to 1:1, preferably 1:20 to 1:1, more preferably 1:10 to 1:1 and most preferably 1:4 to 1:1. Mixed-matrix systems are preferably employed in phosphorescent organic electroluminescent devices. Further details on mixed-matrix systems can be found, for example, in WO 2010/108579.

Apart from these layers, an organic electroluminescent device may also comprise further layers, for example in each case one or more hole-injection layers, hole-transport layers, hole-blocking layers, electron-transport layers, electron-injection layers, exciton-blocking layers, electron-blocking layers, charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*) and/or organic or inorganic p/n junctions. It is possible here for one or more hole-transport layers to be p-doped, for example with metal oxides, such as $MoO_3$ or $WO_3$, or with (per) fluorinated electron-deficient aromatic compounds, and/or for one or more electron-transport layers to be n-doped. It is likewise possible for interlayers, which have, for example, an exciton-blocking function and/or control the charge balance in the electroluminescent device, to be introduced between two emitting layers. However, it should be pointed out that each of these layers does not necessarily have to be present. These layers may likewise be present on use of the ink compositions according to the invention, as defined above.

In a further embodiment of the present invention, the electronic device comprises a plurality of layers. The ink composition according to the invention can preferably be employed here for the production of a hole-transport, hole-injection, electron-transport, electron-injection and/or emission layer.

The present invention accordingly also relates to an electronic device which comprises at least three layers, but in a preferred embodiment all said layers, from hole-injection, hole-transport, emission, electron-transport, electron-injection, charge-blocking and/or charge-generation layer and in which at least one layer has been obtained by means of a ink composition to be employed in accordance with the invention. The thickness of the layers, for example the hole-transport and/or hole-injection layer, can preferably be in the range from 1 to 500 nm, more preferably in the range from 2 to 200 nm.

The electronic device may furthermore comprise layers built up from further low-molecular-weight compounds or polymers which have not been applied by the use of ink compositions according to the invention. These can also be produced by evaporation of low-molecular-weight compounds in a high vacuum.

It may additionally be preferred to use the compounds to be employed not as the pure substance, but instead as a mixture (blend) together with further polymeric, oligomeric, dendritic or low-molecular-weight substances of any desired type. These may, for example, improve the electronic properties or themselves emit.

In a preferred embodiment of the present invention, the ink compositions according to the invention comprise organic functional materials which are employed as host materials or matrix materials in an emitting layer. The ink composition here may comprise the emitters described above in addition to the host materials or matrix materials. The organic electroluminescent device here may comprise one or more emitting layers. If a plurality of emission layers are present, these preferably have a plurality of emission maxima between 380 nm and 750 nm, resulting overall in white emission, i.e. various emitting compounds which are able to fluoresce or phosphoresce are used in the emitting layers. Very particular preference is given to three-layer systems, where the three layers exhibit blue, green and orange or red emission (for the basic structure see, for example, WO 2005/011013). White-emitting devices are suitable, for example, as backlighting of LCD displays or for general lighting applications.

It is also possible for a plurality of OLEDs to be arranged one above the other, enabling a further increase in efficiency with respect to the light yield to be achieved.

In order to improve the coupling-out of light, the final organic layer on the light-exit side in OLEDs can, for example, also be in the form of a nano-foam, resulting in a reduction in the proportion of total reflection.

Preference is furthermore given to an organic electroluminescent device in which one or more layers are applied by means of a sublimation process, in which the materials are applied by vapour deposition in vacuum sublimation units at a pressure below $10^{-5}$ mbar, preferably below $10^{-6}$ mbar, more preferably below $10^{-7}$ mbar.

It may furthermore be provided that one or more layers of an electronic device according to the invention are applied by means of the OVPD (organic vapour phase deposition) process or with the aid of carrier-gas sublimation, in which the materials are applied at a pressure between $10^{-5}$ mbar and 1 bar.

It may furthermore be provided that one or more layers of an electronic device according to the invention are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing.

An orthogonal solvent can preferably be used here, which, although dissolving the functional material of a layer to be applied, does not dissolve the layer to which the functional material is applied.

The electronic device usually comprises a cathode and an anode (electrodes). The electrodes (cathode, anode) are selected for the purposes of the present invention in such a way that their band energies correspond as closely as possible to those of the adjacent, organic layers in order to ensure highly efficient electron or hole injection.

The cathode preferably comprises metal complexes, metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, can also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali-metal or alkaline-earth metal fluorides, but also the corresponding oxides (for example LiF, $Li_2O$, $BaF_2$, MgO, NaF, etc.). The layer thickness of this layer is preferably between 0.1 and 10 nm, more preferably between 0.2 and 8 nm, and most preferably between 0.5 and 5 nm.

The anode preferably comprises materials having a high work function. The anode preferably has a potential greater than 4.5 eV vs. vacuum. Suitable for this purpose are on the one hand metals having a high redox potential, such as, for example, Ag, Pt or Au. On the other hand, metal/metal oxide electrodes (for example $Al/Ni/NiO_x$, $Al/PtO_x$) may also be preferred. For some applications, at least one of the electrodes must be transparent in order to facilitate either irradiation of the organic material (O-SCs) or the coupling-out of light (OLEDs/PLEDs, O-lasers). A preferred structure uses a transparent anode. Preferred anode materials here are conductive, mixed metal oxides. Particular preference is given to indium tin oxide (ITO) or indium zinc oxide (IZO). Preference is furthermore given to conductive, doped organic materials, in particular conductive, doped polymers, such as, for example, poly(ethylenedioxythiophene) (PEDOT) and polyaniline (PANI) or derivatives of these polymers. It is furthermore preferred for a p-doped hole-transport material to be applied as hole-injection layer to the anode, where suitable p-dopants are metal oxides, for example $MoO_3$ or $WO_3$, or (per)fluorinated electron-deficient aromatic compounds. Further suitable p-dopants are HAT-CN (hexacyanohexaazatriphenylene) or the compound NPD9 from Novaled. A layer of this type simplifies hole injection in materials having a low HOMO, i.e. an HOMO with a large value.

In general, all materials as are used for the layers in accordance with the prior art can be used in the further layers, and the person skilled in the art will be able to combine each of these materials with the materials according to the invention in an electronic device without inventive step.

The electronic device is correspondingly structured in a manner known per se, depending on the application, provided with contacts and finally hermetically sealed, since the lifetime of such devices is drastically shortened in the presence of water and/or air.

The invention is described in more detail in reference to the following examples, which are only illustrative and do not limit the scope of the invention.

All features of the present invention can be combined with one another in any way.

Each feature disclosed in this specification, unless stated otherwise, may be replaced by alternative features serving the same, equivalent, or similar purpose. Thus, unless stated otherwise, each feature disclosed is but one example of a generic series of equivalent or similar features.

Definition of Terms

The term "semiconductor" means a material which has electrical conductivity to a degree between that of a conductor (such as copper) and that of an insulator (such as glass) at room temperature.

The term "organic" means any material containing carbon atoms or any compound that containing carbon atoms ionically bound to other atoms such as carbon monoxide, carbon dioxide, carbonates, cyanides, cyanates, carbides, and thiocyanates.

The term "emission" means the emission of electromagnetic waves by electron transitions in atoms and molecules.

The working examples below provide descriptions of the present invention, as well as an in detail description of their fabrication.

WORKING EXAMPLES

The viscosity of the solvents was measured using a 1° cone-plate rotational rheometer of the type Discovery AR3 (Thermo Scientific), where the temperature and sheer rate were exactly controlled. The viscosities given in Table 2 are the viscosities of each solvents measured at a temperature of 25.0° C. (+/−0.2° C.) and a sheer rate of 500 s$^{-1}$. The measurements were carried out with the following setup: Discovery AR3 with bottom plate TMP60 and cone C60/1° Ti L.; $N_2$ supply with a back-pressure of ~1.8 bar; sample volume of 1.3 ml. Each solvent was measured three times. The stated viscosity value was averaged over said measurements. The data processing was performed with the software "Haake RheoWin Job Manager" in accordance with DIN 1342-2. The equipment (Discovery AR3 from Thermo Scientific) was regularly calibrated by Thermo Scientific and received a certified standard factory calibration before its first use.

The surface tension measurements were performed using the high precision drop shape analysis tool FTA 1000 from First Ten Angstrom. The surface tension was determined by the software "FTA 1000". All measurements were performed at room temperature being in the range between 22° C. and 24° C. The standard operating procedure includes the determination of the surface tension of each solvent (sample volume of 0.3 mL) using a fresh disposable drop dispensing system (syringe and needle). Each drop was measured over the duration of one minute with sixty measurements which were later on averaged. For each solution three drops were measured. The final value was averaged over said measurements. The tool was regularly cross-checked against various liquids having well known surface tension.

Table 2 shows the boiling point, surface tension and viscosity of the solvents used in the working examples.

TABLE 2

| Solvents | Viscosity (cp) @25° C. | Surface tension (dyne/cm) | Boiling point (° C.) |
|---|---|---|---|
| 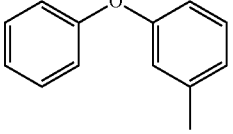<br>3-phenoxytoluene, CAS: 3586-14-9 | 4.4 | 37.8 | 272 |
| 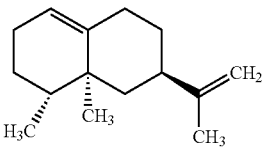<br>Valencene, CAS: 4630-07-3 | 5.3 | 29.7 | 274 |
| 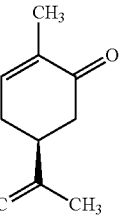<br>D-carvone (including R-carvone and S-carvone), CAS: 2244-16-8 | 2.3 | 34.8 | 225 |

TABLE 2-continued
| Solvents | Viscosity (cp) @25° C. | Surface tension (dyne/cm) | Boiling point (° C.) |
|---|---|---|---|
| 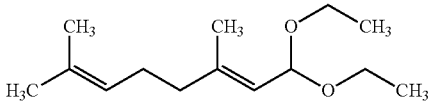 Citral diethyl acetal, CAS: 7549-37-3 | 2.4 | 27.2 | 271 |
| 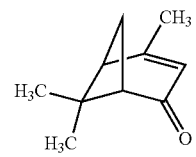 Verbenone, CAS: 1196-01-6 | 4.7 | 29.5 | 227 |
Table 3 shows the materials used in the following working examples.
TABLE 3
Materials
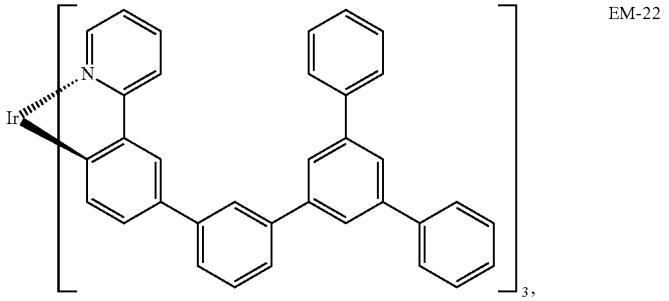
EM-22
Mw = 1568 g/mol
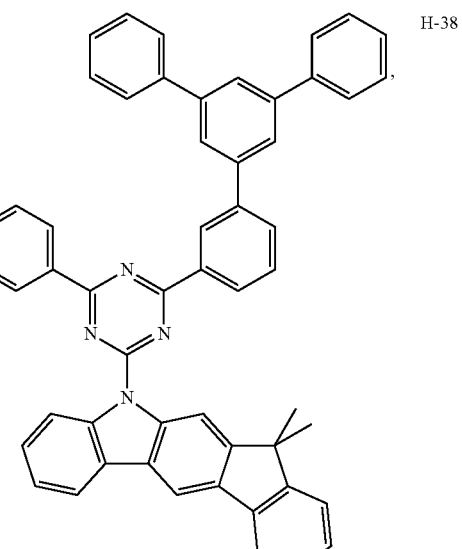
H-38
Mw = 971 g/mol TABLE 3-continued Materials

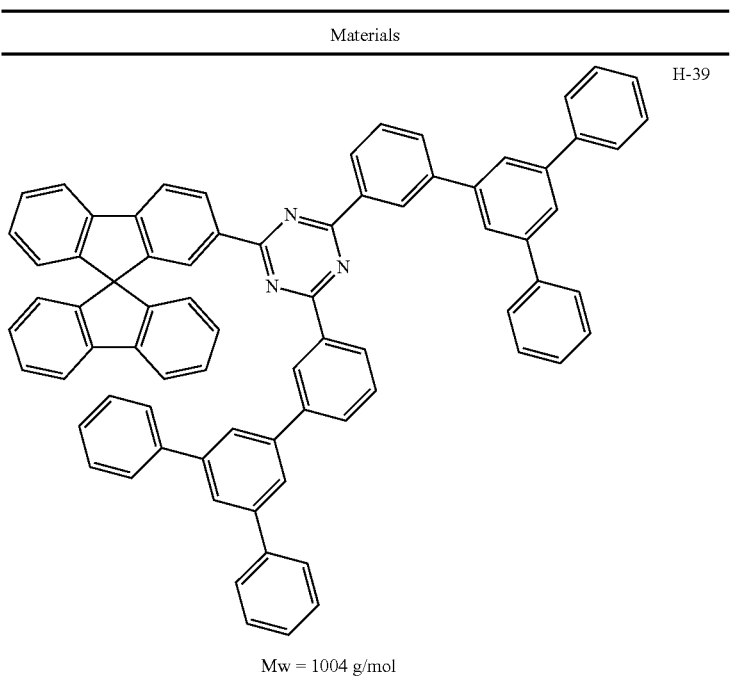

H-39

Mw = 1004 g/mol

Working Example 1

An ink composition made from 2 wt. % of solid consists of H-38:H-39:EM-22 (2:5:3) dissolved in D-carvone was printed onto a bank structured substrate as the active layer in an OLED application. After vacuum dried, a thin homogenous organic layer is observed (FIG. 2).

Working Example 2

An ink composition made up of from 97.5 wt. % of Verbenone and 2.5 wt. % of solid consists of H-38:H-39:EM-22 (2:5:3) was printed onto a bank structured substrate as the active layer in an OLED application. After vacuum dried, a thin homogenous organic layer is observed (FIG. 3).

Working Example 3

An ink composition made from 3 wt. % of solid consists of H-38:H-39:EM-22 (2:5:3) dissolved in 3-Phenoxytoluene:D-carvone (90:10) was printed onto a bank structured substrate as the active layer in an OLED application. After vacuum dried, a thin homogenous organic layer is observed (FIG. 4).

Working Example 4

Figure 5:
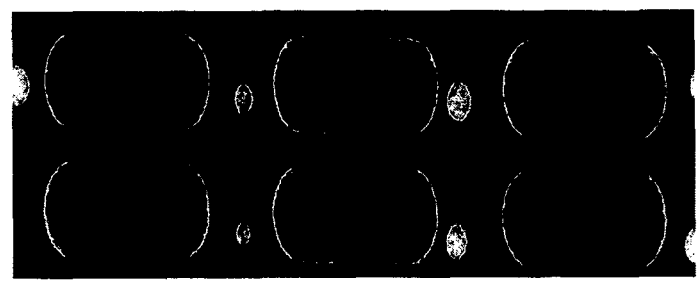

An ink composition made from 3 wt. % of solid consists of H-38:H-39:EM-22 (2:5:3) dissolved in 3-Phenoxytoluene:D-carvone (10:90) was printed onto a bank structured substrate as the active layer in an OLED application. After vacuum dried, a thin homogenous organic layer is observed (FIG. 5).

Working Example 5

Figure 6:
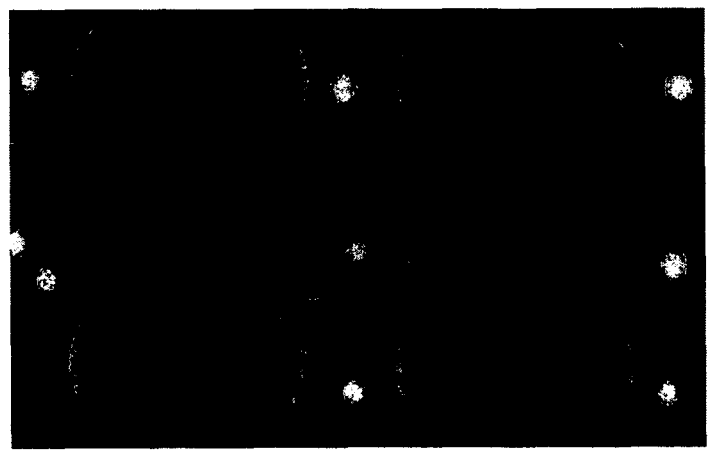

An ink composition made from 3 wt. % of solid consists of H-38:H-39:EM-22 (2:5:3) dissolved in 3-Phenoxytoluene:D-carvone (50:50) was printed onto a bank structured substrate as the active layer in an OLED application. After vacuum dried, a thin homogenous organic layer is observed (FIG. 6).

Working Example 6

Figure 7:

An ink composition made from 3 wt. % of solid consists of H-38:H-39:EM-22 (2:5:3) dissolved in 3-Phenoxytoluene:Citral diethyl acetal (90:10) was printed onto a bank structured substrate as the active layer in an OLED application. After vacuum dried, a thin homogenous organic layer is observed (FIG. 7).

Working Example 7

Figure 8:
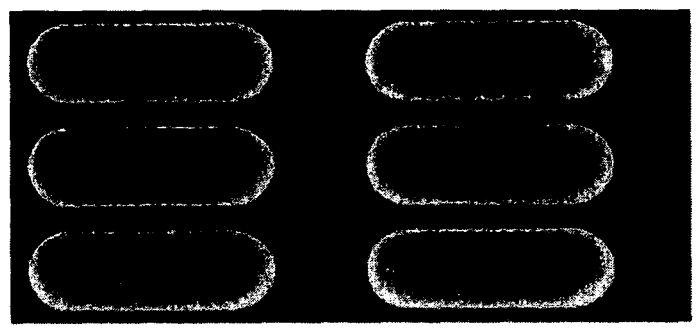

An ink composition made from 3 wt. % of solid consists of H-38:H-39:EM-22 (2:5:3) dissolved in 3-Phenoxytoluene:valencene (90:10) was printed onto a bank structured substrate as the active layer in an OLED application. After vacuum dried, a thin homogenous organic layer is observed (FIG. 8).

Working Example 8

Figure 9:
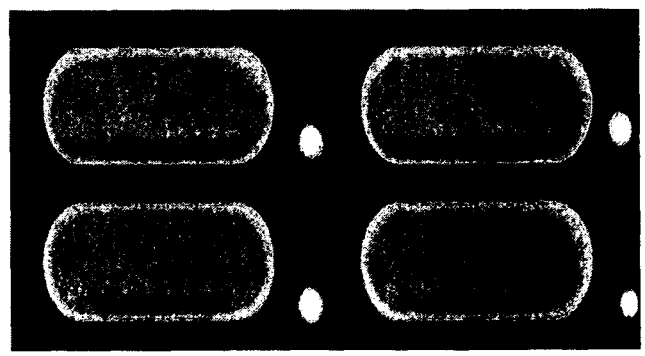

An ink composition made from 3 wt. % of solid consists of H-38:H-39:EM-22 (2:5:3) dissolved in 3-Phenoxytoluene:Verbenone (90:10) was printed onto a bank structured substrate as the active layer in an OLED application. After vacuum dried, a thin homogenous organic layer is observed (FIG. 9).

Working Example 9

Figure 10:
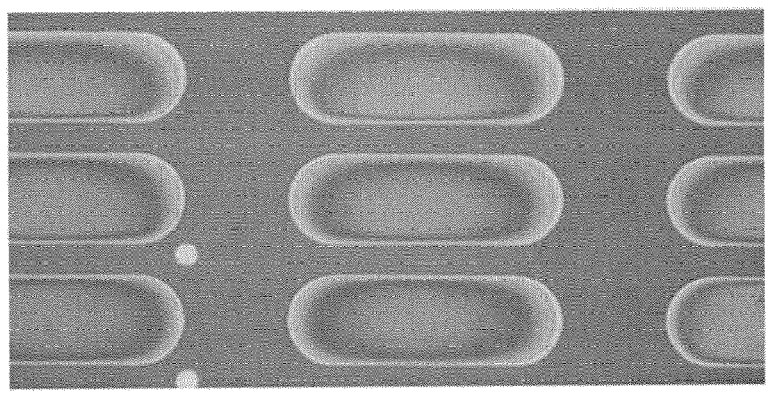

An ink composition made from 3 wt. % of solid consists of H-38:H-39:EM-22 (2:5:3) dissolved in 3-Phenoxytoluene:Verbenone (50:50) was printed onto a bank structured substrate as the active layer in an OLED application. After vacuum dried, a thin homogenous organic layer is observed (FIG. 10).

Device Performance

Working Example 10

An inkjet printed OLED device was prepared with using D-carvone:3-phenoxytolunene solvent mixture.

The structure of the pixelated OLED device was glass substrate/ITO/HIL (40 nm)/HTL (20 nm) l/EML (60 nm)/ HBL (10 nm)/ETL (40 nm)/Al whereby the bank of pixelated OLED device was prefabricated on the substrate to form 212 μm×64 μm size pixel.

Description of Fabrication Process

Glass substrates covered with pre-structured ITO and bank material were cleaned using ultrasonication in isopropanol followed by de-ionized water, then dried using an air-gun and a subsequent annealing on a hot-plate at 230° C. for 2 hours.

A hole-injection layer (HIL) using PEDOT-PSS (Clevios A14083, Heraeus) was inkjet-printed onto the substrate and dried in vacuum. The HIL was then annealed at 185° C. for 30 minutes in air.

On top of the HIL, a hole-transport layer (HTL) was inkjet-printed, dried in vacuum and annealed at 210° C. for 30 minutes in nitrogen atmosphere. As material for the hole-transport layer polymer HTM-1 was used. The structure of the polymer HTM-1 is the following:

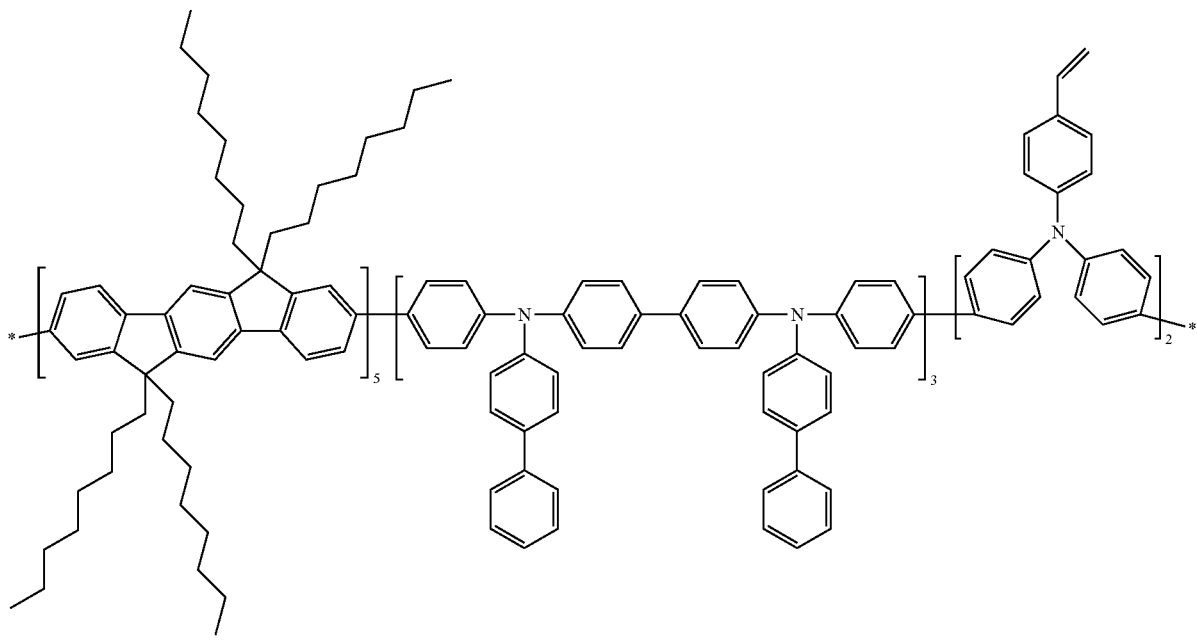

The green emissive layer (G-EML) was also inkjet-printed, vacuum dried and annealed at 160° C. for 10 minutes in nitrogen atmosphere. The ink for the green emissive layer contained in all working examples two host materials (i.e. H-38 and H-39) as well as one triplett emitter (EM-22). The materials were used in the following ratio: H-38:H-39:EM-22=20:50:30. Only the solvent(s) differ from example to example, as can be seen from Table 3.

All the inkjet printing processes were done under yellow light and under ambient conditions.

The devices were then transferred into the vacuum deposition chamber were the deposition of a hole blocking layer (HBL), an electron-transport layer (ETL), and a cathode (Al) was done using thermal evaporation. The devices were then characterized in the glovebox.

As a hole-blocking material for the hole blocking layer ETM-1 was used. The material has the following structure:

ETM-1

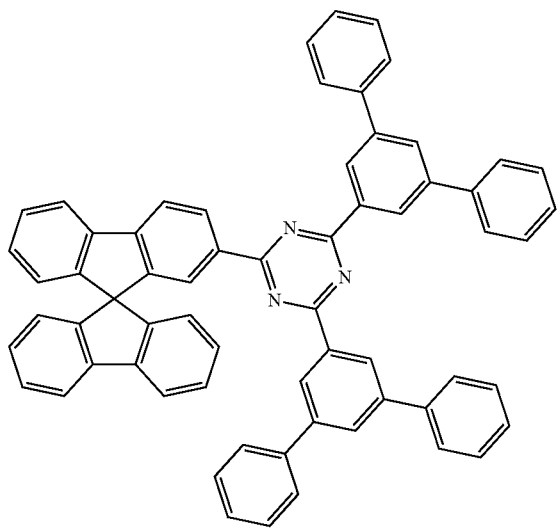

In the electron transport layer (ETL) a 50:50 mixture of ETM-1 and LiQ was used. LiQ is lithium 8-hydroxyquinolinate.

To measure the OLED performance in current density-luminance-voltage performance, the device was driven by sweeping voltage from −5 V to 25 V provided by a Keithley 2400 source measure unit. The voltage over the OLED device as well as the current through the OLED devices were recorded by the Keithley 2400 SMU. The brightness of the device was detected with a calibrated photodiode. The photo current was measured with a Keithley 6485/E picoammeter. For the spectra, the brightness sensor was replaced by a glass fiber which is connected to an Ocean Optics USB2000+ spectrometer.

Figure 11:
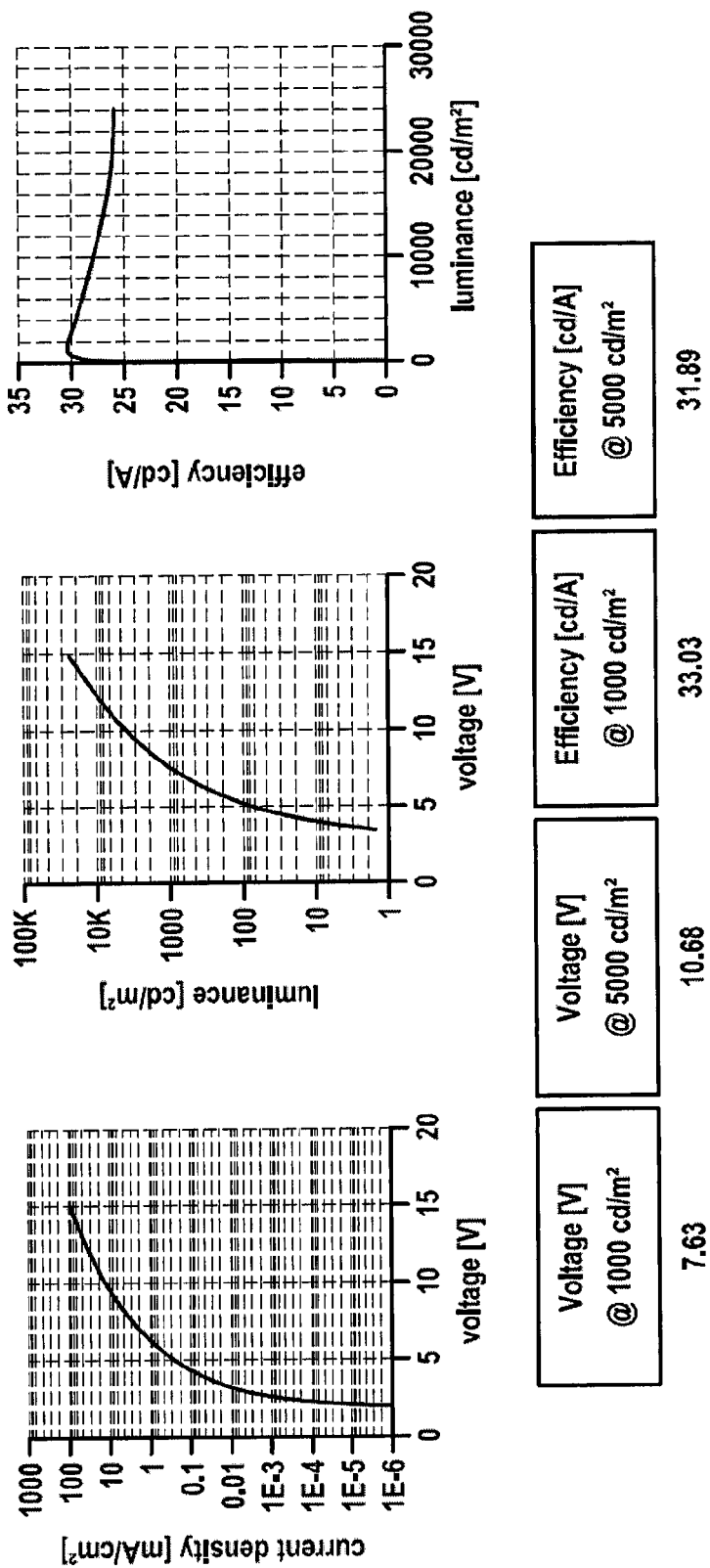
FIG. 11 to 14: show device performances of the electronic devices prepared in working examples 10 to 13.

The device performance is shown in FIG. 11.

Working Example 11

Figure 12:
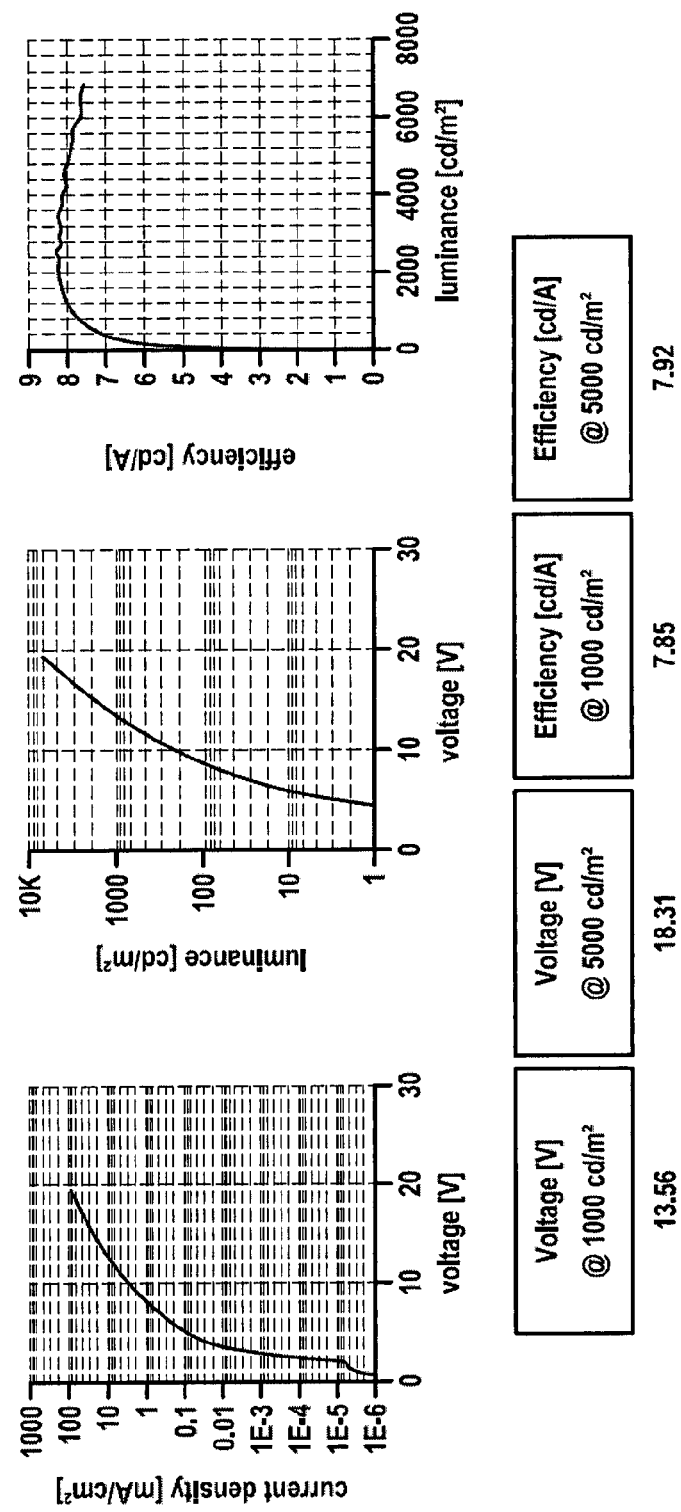

An inkjet printed OLED device was prepared in the same manner as described in working example 10, except for valencene: 3-phenoxytoluene (50:50) at 20 mg/ml concentration was used instead of D-carvone:3-phenoxytoluene (10:90). The device performance is shown in FIG. 12.

Working Example 12

Figure 13:
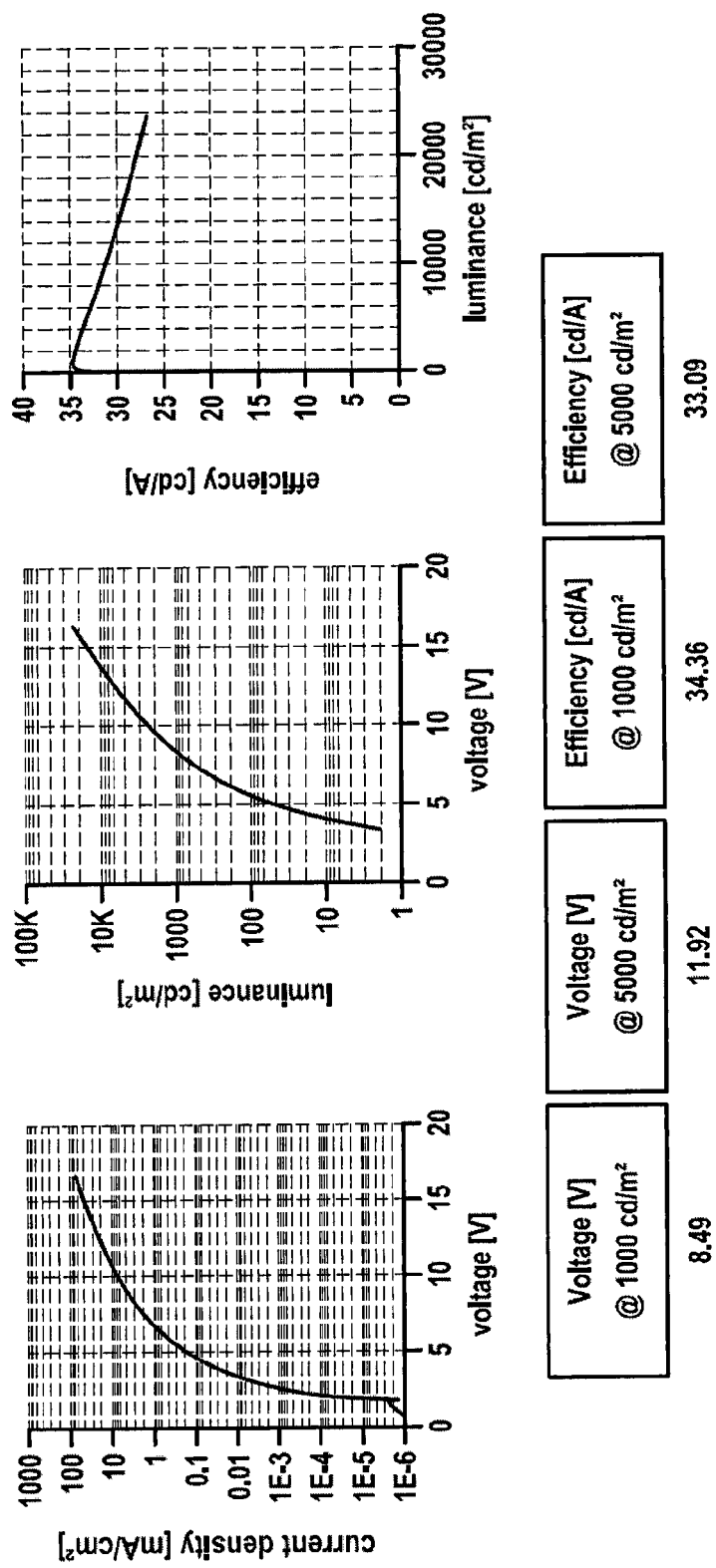

An inkjet printed OLED device was prepared in the same manner as described in working example 10, except for Verbenone at 20 mg/ml concentration was used instead of D-carvone:3-phenoxytoluene (10:90). The device performance is shown in FIG. 13.

Working Example 13

Figure 14:
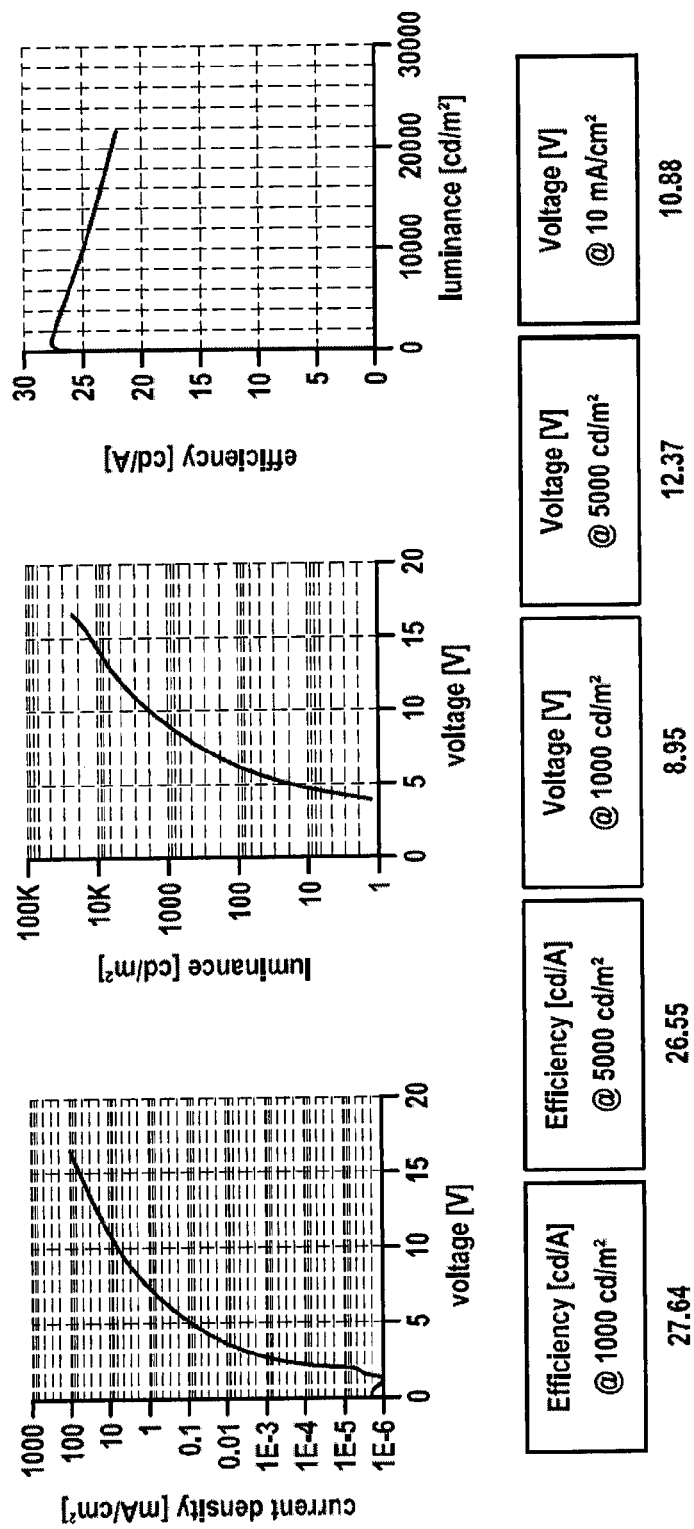

An inkjet printed OLED device was prepared in the same manner as described in working example 10, except for verbenone: 3-phenoxytoluene (50:50) at 20 mg/ml concentration was used instead of D-carvone:3-phenoxytoluene (10:90). The device performance is shown in FIG. 14.

Working Example 14

An ink composition made from 3 wt. % of solid consists of H-38:H-39:EM-22 (2:5:3) dissolved in Citral diethyl acetal (its boiling point is 271° C.) was printed onto a bank structured substrate as the active layer in an OLED application and image captured by Dimatix Materials Printer DMP-2831.

Figure 15:
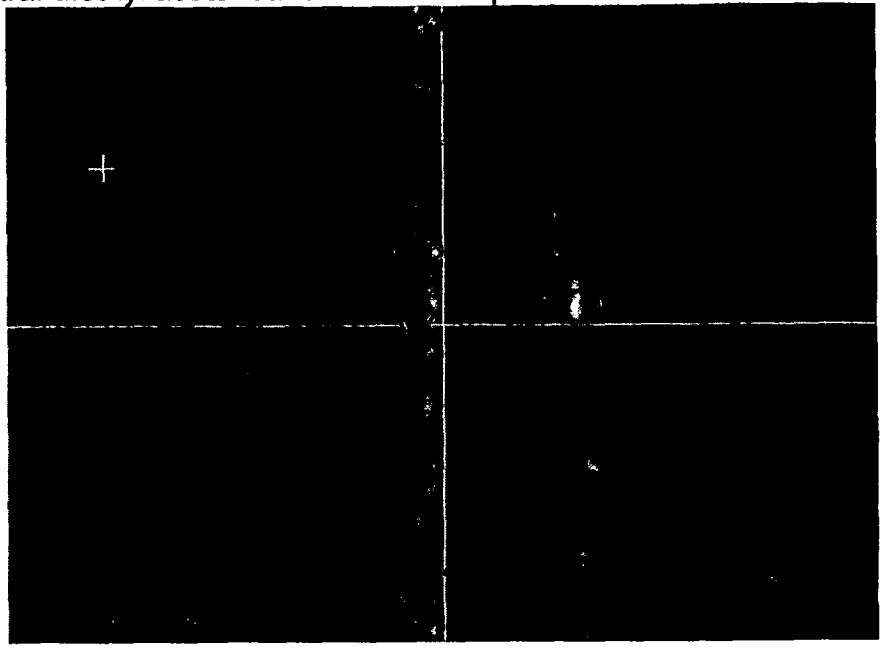
FIGS. 15 (a), (b): show the images of wet printed substrate using EML formulation consist of citral diethyl acetal as the solvent. The pictures were taken right after the whole substrate was printed at t=0 s in (a) and t=39 s in (b).
Figure 15:
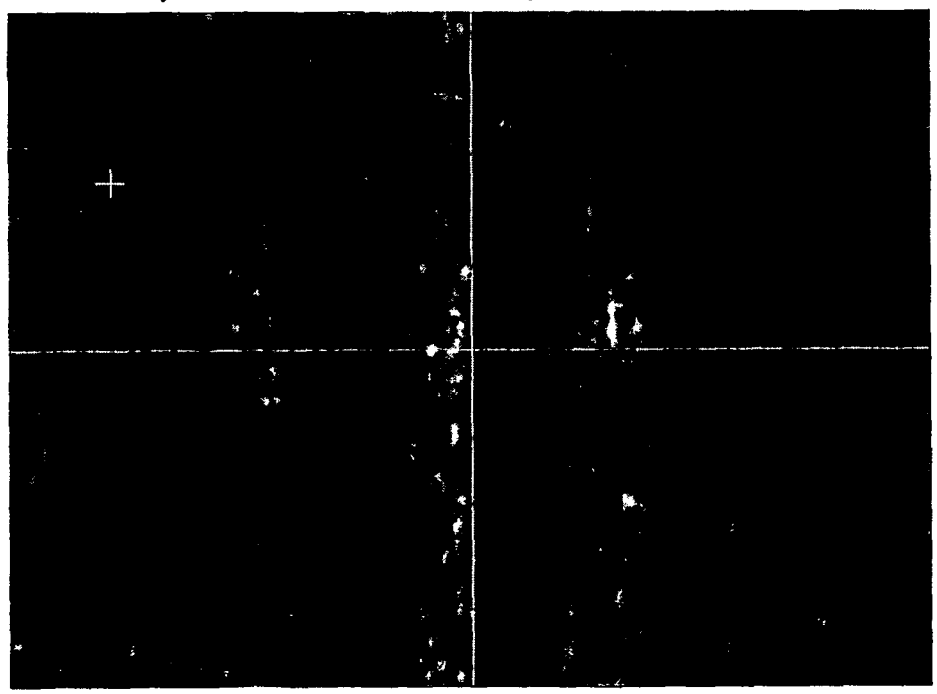

FIG. 15 (a) shows image captured of pixels prepared using ink compositions of working example 14 at t=0 s.

FIG. 15 (b) shows photoluminescent (PL) images of pixels prepared using ink compositions of working example 14 at t=39 s.

Comparative Example

An ink composition made from 3 wt. % of solid consists of H-38:H-39:EM-22 (2:5:3) dissolved in limonene (the boiling point is 176° C.) was printed onto a bank structured substrate as the active layer in an OLED application.

Figure 16:
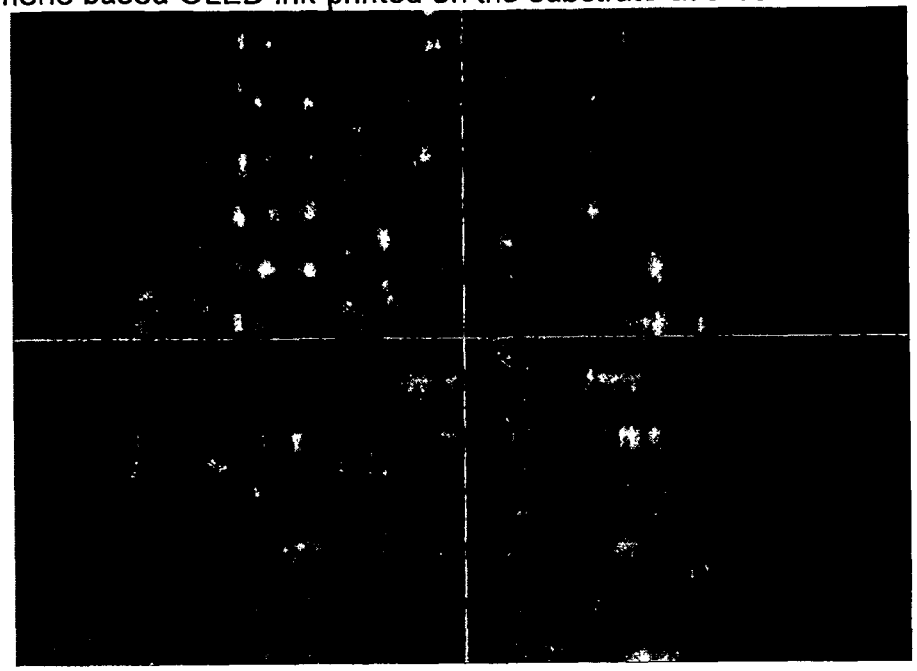
FIGS. 16 (a), (b): show the images of wet printed substrate using EML formulation consist of limonene as the solvent. The pictures were taken right after the whole substrate was printed at time, t=0 s in (a) and t=41 s in (b) where the dried pixels were shown in the rectangle shape.
Figure 16:

FIG. 16 (a) shows image captured of pixels prepared using ink compositions of the comparative example at t=0 s.

FIG. 16 (b) shows image captured of pixels prepared using ink compositions of the comparative example at t=41 s.

Working Example 15: Observation

After the samples showed in FIGS. 15 and 16 were vacuum dried to remove the solvents from the printed organic film, the profile of the printed layer were measured using Dektak profilometer in air.

Figure 17:
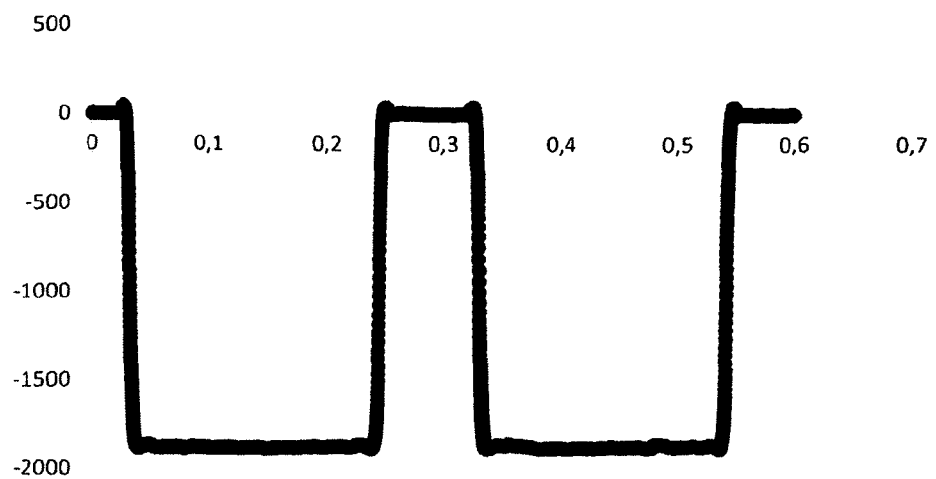
FIG. 17 (a): shows the dried film profile of pixels using limonene based formulation in full scale where the bank is around 1900 nm the film is deposited in the well. 17 (b): shows the zoom in profile of dried film printed using limonene based formulation.
Figure 17:
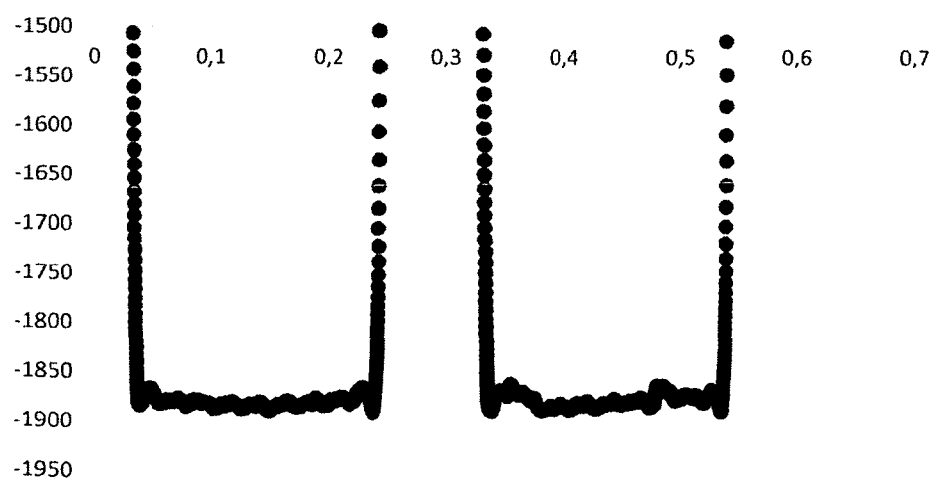

FIG. 17 (a) shows the profile of printed organic layer on bank structured substrate. The organic layer were formed by printing ink with compositions stated in working example 14 whereby citral diethyl acetal was used as solvent followed by vacuum drying. This profile was taken using Dektak profilometer.

FIG. 17 (b) shows the zoom-in profile of FIG. 17 (a) whereby the organic film profile roughness is shown less than 30 nm.

Figure 18:
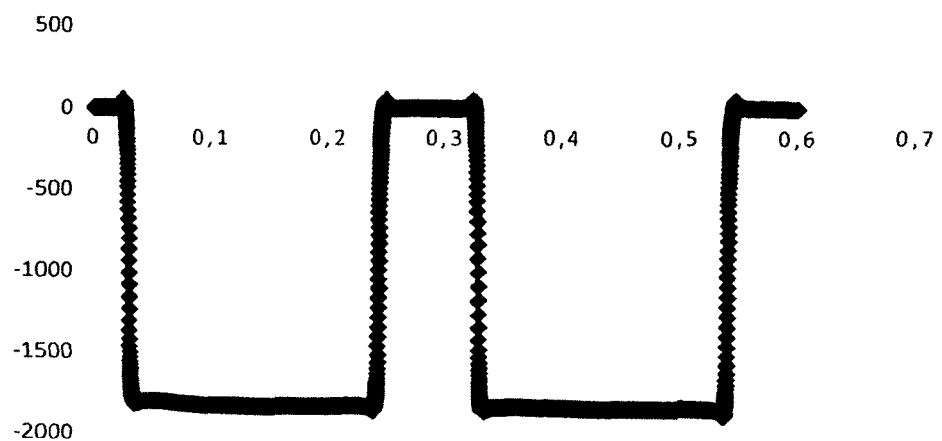
FIG. 18 (a): shows the dried film profile of pixels using citral diethyl acetal based formulation in full scale where the bank is around 1900 nm the film is deposited in the well. (b): shows the zoom in profile of dried film printed using limonene based formulation.
Figure 18:
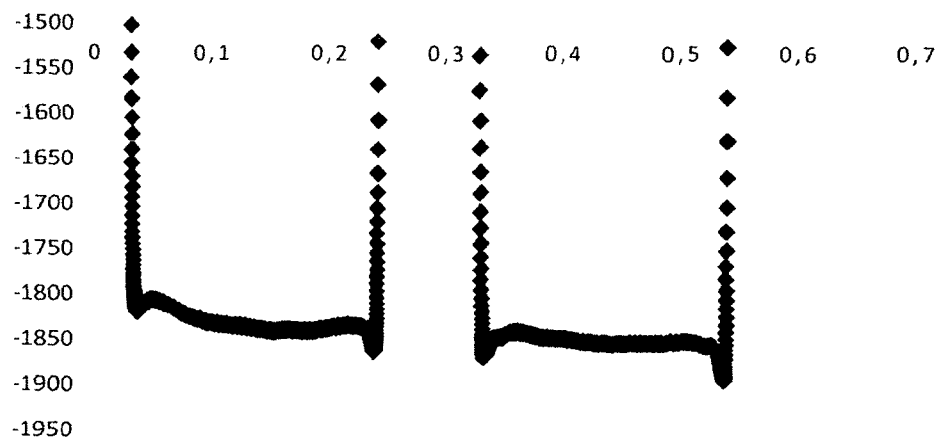

FIG. 18 (a) shows the profile of printed organic layer on bank structured substrate. The organic layer were formed by printing ink with compositions stated in working example 14 whereby limonene was used as solvent followed by vacuum drying. This profile was taken using Dektak profilometer.

FIG. 18 (b) shows the zoom-in profile of FIG. 18 (a) whereby the organic film profile variation from pixel to pixel are more than 70 nm.

As it can be seen in FIGS. 15 (a) and (b), the high boiling point terpene (or terpenoid) solvent of the present invention, such as Citral diethyl acetal based solvent of working example 14, can remain as wet after 39 s printed in the well of the substrate and it gives larger process window for the tact time in the production of organic device production.

In FIGS. 17 (a) and (b), the organic functional layer made from the high boiling point solvent of the present invention, such as Citral diethyl acetal based solvent of working example 14, shows better layer homogeneity.

The invention claimed is:
1. An ink composition comprising at least one organic functional material having a molecular weight of at most 5,000 g/mol and at least a first organic solvent having a boiling point in the range from 200° C. to 320° C., wherein the first organic solvent is selected from the group consisting of terpenes, terpenoids, and a combination thereof, wherein the terpenes comprise a unit of formula (I), and a unit of formula (III), and do not contain a unit of formula (II), a unit of formula (IV), and a unit of formula (V), wherein the terpenoids comprise at least one unit selected from the group consisting of a unit of formula (II), a unit of formula (IV), and a unit of formula (V)

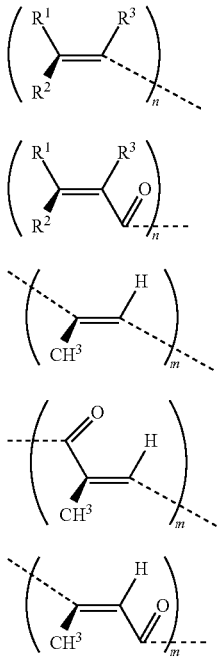

(I)

(II)

(IV)

(V)

wherein,
$R^1$, $R^2$ and $R^3$ are, identically or differently at each occurrence, H or $CH_3$, and at least any one of $R^1$, $R^2$ and $R^3$ is $CH_3$; n is an integer from 1 to 2; m is an integer from 1 to 3; and the dashed lines are, each independently, a bond connected to the molecule.

2. The ink composition according to claim 1, wherein the terpene is an organic solvent having one or more of building blocks delivered from the hydrocarbon isoprene (2-methyl-1,3-butadiene).

3. The ink composition according to claim 1, wherein the terpenoid is an organic solvent having one or more of building blocks delivered from the hydrocarbon isoprene and in addition containing at least one ketone group.

4. The ink composition according to claim 1, wherein the terpenes comprise a unit of formula (I), and the terpenoids comprise a unit of formula (II)

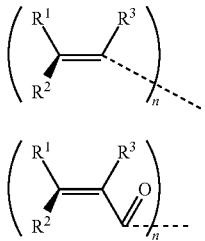

(I)

(II)

wherein, $R^1$, $R^2$ and $R^3$ are, identically or differently at each occurrence, H or $CH_3$, and at least any one of $R^1$, $R^2$ and $R^3$ is $CH_3$; n is an integer from 1 to 2; and the dashed line is a bond connected to the molecule.

5. The ink composition according to claim 1 wherein the terpenes comprise a unit of formula (III), and the terpenoids comprise a unit of formula (IV), or a unit of formula (V).

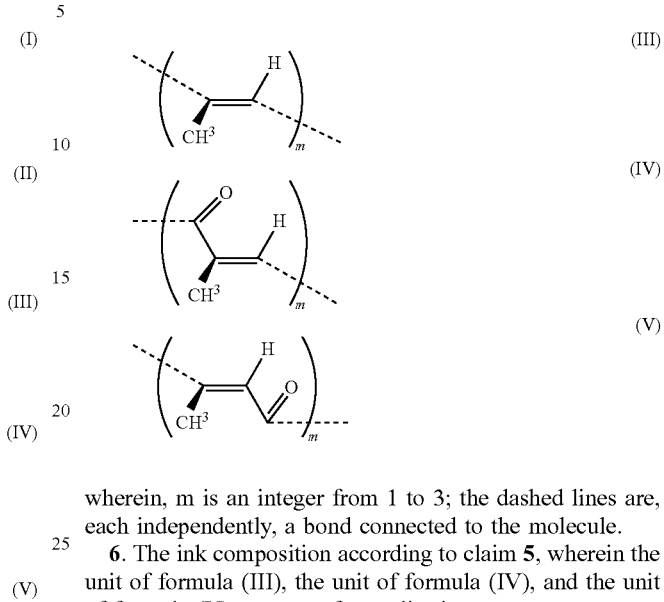

(III)

(IV)

(V)

wherein, m is an integer from 1 to 3; the dashed lines are, each independently, a bond connected to the molecule.

6. The ink composition according to claim 5, wherein the unit of formula (III), the unit of formula (IV), and the unit of formula (V) are part of a cyclic ring system.

7. The ink composition according to claim 1, wherein the terpenes comprise a unit of formula (I) and a unit of formula (III) and both units are part of a linear chain, and wherein the terpenoids comprise at least two units, one is selected from unit (I) or unit (II), and the other is a unit of formula (IV), or a unit of formula (V), and both units of the terpenoids are part of a linear chain.

8. The ink composition according to claim 1, wherein the absolute viscosity of the first organic solvent at 25° C. is in the range from 1.0 cp to 20 cp.

9. The ink composition according to claim 1, wherein the liquid surface tension of the first organic solvent is in the range from 24 dyne/cm to 70 dyne/cm at 25° C.

10. The ink composition according to claim 1, wherein the first organic solvent is selected from the group consisting of valencene, β-caryophyllene, D-carvone, citral diethyl acetal, verbenone, nerol, menthone, citral, derivatives thereof, and mixtures thereof.

11. The ink composition according to claim 1, wherein the organic functional material is selected from the group consisting of organic conductors, organic semiconductors, organic fluorescent compounds, organic phosphorescent compounds, organic light-absorbent compounds, organic light-sensitive compounds, organic photosensitisation agents, organometallic complexes of transition metals, rare earths, lanthanides and actinides.

12. The ink composition according to claim 1, wherein the organic functional material is selected from the group consisting of fluorescent emitters, phosphorescent emitters, host materials, matrix materials, exciton-blocking materials, electron-transport materials, electron-injection materials, hole-conductor materials, hole-injection materials, negative type organic dopants, positive type organic dopants, wide-band-gap materials, electron-blocking materials, hole-blocking materials, and a combination of any of these.

13. The ink composition according to claim 1, wherein the molecular weight of the organic functional material is in the range from 300 g/mol to 3,000 g/mol.

14. The ink composition according to claim 1, wherein the content of the organic functional material in the ink composition is in the range from 0.0001 wt. % to 20 wt. % based on the total weight of the ink composition.

15. A method of utilizing the ink composition according to claim 1 in an electronic device fabrication process.

16. A method for fabricating an electronic device, wherein the method comprises step (x) and step (y) in this sequence:
   (x) printing the ink composition according to claim 1, onto a surface of one layer of the electronic device; and
   (y) evaporating the solvent.

17. An electronic device containing one functional layer comprising one organic functional material fabricated by the method according to claim 16.

* * * * *